(12) United States Patent
Wu et al.

(10) Patent No.: US 9,408,300 B2
(45) Date of Patent: Aug. 2, 2016

(54) FLEXIBLE DEVICE AND FABRICATION METHOD OF FLEXIBLE DEVICE

(71) Applicant: Industrial Technology Research Institute, Hsinchu (TW)

(72) Inventors: Cheng-Che Wu, New Taipei (TW); Chen-Chu Tsai, Taichung (TW); Chien-Jung Huang, Tainan (TW); Yung-Hui Yeh, Hsinchu (TW); Heng-Yin Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/620,214

(22) Filed: Feb. 12, 2015

(65) Prior Publication Data
US 2016/0174358 A1    Jun. 16, 2016

(30) Foreign Application Priority Data
Dec. 16, 2014   (TW) .............................. 103143848 A

(51) Int. Cl.
| | |
|---|---|
| *H05K 1/02* | (2006.01) |
| *H05K 3/00* | (2006.01) |
| *H05K 1/11* | (2006.01) |
| *H05K 3/40* | (2006.01) |
| *H05K 3/46* | (2006.01) |

(52) U.S. Cl.
CPC ............... *H05K 1/028* (2013.01); *H05K 1/115* (2013.01); *H05K 3/007* (2013.01); *H05K 3/4038* (2013.01); *H05K 3/4644* (2013.01); *H05K 2201/095* (2013.01); *H05K 2203/107* (2013.01)

(58) Field of Classification Search
CPC ..... H05K 1/028; H05K 1/115; H05K 3/4038; H05K 3/007
See application file for complete search history.

(56) References Cited

U.S. PATENT DOCUMENTS

| | | | |
|---|---|---|---|
| 2013/0002685 A1 | 1/2013 | Shenoy et al. | |
| 2014/0094079 A1 | 4/2014 | Ito et al. | |

FOREIGN PATENT DOCUMENTS

| | | |
|---|---|---|
| TW | 201221268 | 6/2012 |
| TW | I381558 | 1/2013 |

OTHER PUBLICATIONS

Heise et al., "Optimization of picosecond laser structuring for the monolithic serial interconnection of CIS solar cells," Progress in Photovoltaics: Research and Applications, Jun. 2013, pp. 681-692.

*Primary Examiner* — Jeremy C Norris
(74) *Attorney, Agent, or Firm* — Jianq Chyun IP Office

(57) ABSTRACT

According to embodiments of the disclosure, a flexible device and a fabrication method thereof are provided. The flexible device has a first area and a second area, and the stiffness of a portion of the first area is greater than the stiffness of the second area. The flexible device may include a flexible substrate and a rigid element. The flexible substrate includes a first surface and a second surface opposite to each other. The second surface has a coarse structure. The surface roughness of the second surface is greater in the first area than in the second area. The rigid element is disposed on the first surface of the flexible substrate and located in the first area. The stiffness of the rigid element is greater than the stiffness of the flexible substrate. A projection area of the coarse structure on the flexible substrate overlaps an area of the rigid element.

20 Claims, 31 Drawing Sheets

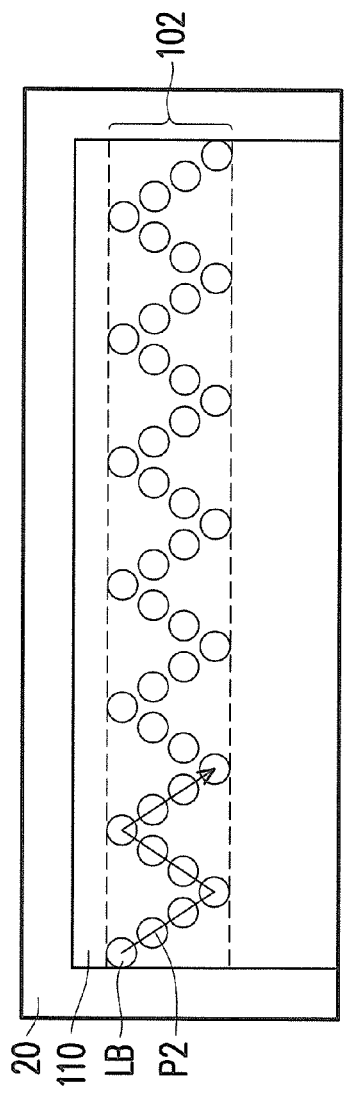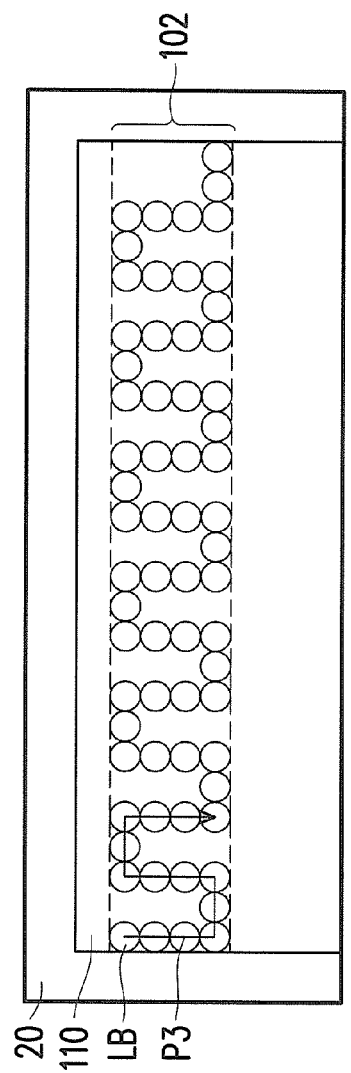

FLEXIBLE DEVICE AND FABRICATION METHOD OF FLEXIBLE DEVICE

CROSS-REFERENCE TO RELATED APPLICATION

This application claims the priority benefit of Taiwan application serial no. 103143848, filed on Dec. 16, 2014. The entirety of the above-mentioned patent application is hereby incorporated by reference herein and made a part of this specification.

TECHNICAL FIELD

The disclosure relates to a flexible device and a fabrication method thereof.

BACKGROUND

A flexible device needs a flexible substrate to achieve the characteristic of flexibility. However, the flexibility characteristic of the flexible substrate causes the issue that an electronic element may not be directly fabricated on the flexible substrate. To fabricate an electronic element on the flexible substrate, the flexible substrate needs to be adhered on a rigid carrier or machine, so as to provide a suitable support via the carrier or the machine, and thereby the electronic element may be formed on the flexible substrate. In this way, after the fabrication of the electronic element is complete, the flexible substrate needs to be removed from the rigid carrier or machine.

A release layer may be used to join the flexible substrate and the carrier, after the fabrication of the electronic element is complete, the flexible substrate may be removed from the carrier. A suitable peel force is applied via a mechanical stripping technique to separate the flexible substrate from the carrier. The adhesion provided by the release layer is not high, and therefore a large peel force does not need to be applied during mechanical stripping. However, when an electronic element is fabricated on the flexible substrate, the stiffness of the overall device is not uniform, that is, the stiffness of some areas is relative greater, and therefore different peel forces need to be applied during mechanical stripping. Damage to elements may occur in the area to which a greater peel force is applied, which is not good for production yield.

SUMMARY

According to one embodiment of the disclosure provides a flexible device. The flexible device has a first area and a second area, and the stiffness of a portion of the first area is greater than the stiffness of the second area. The flexible device may include a flexible substrate and a rigid element. The flexible substrate includes a first surface and a second surface opposite to each other, and the second surface of the flexible substrate has a coarse structure in the first area, such that the surface roughness of the second surface in the first area is greater than the surface roughness of the second surface in the second area. The rigid element is disposed on the first surface of the flexible substrate and located in the first area, wherein the stiffness of the rigid element is greater than the stiffness of the flexible substrate and a projection area of the coarse structure on the flexible substrate overlaps an area of the rigid element.

According to one embodiment of the disclosure provides a fabrication method of a flexible device. The fabrication method of the flexible device may include temporarily adhering a flexible substrate onto a carrier via a release layer, wherein the flexible substrate has a first surface and a second surface, and the second surface is in contact with the release layer; forming at least one element on the first surface of the flexible substrate to form a flexible device, wherein the flexible device has a first area and a second area, and the stiffness of a portion of the first area is greater than the stiffness of the second area; and irradiating a laser beam from the carrier toward the release layer located in the first area, and the irradiation path of the laser beam falls in the first area.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 16 and FIG. 17 are two other embodiments of the irradiation method of a laser beam in the step of FIG. 2A.

DETAILED DESCRIPTION OF DISCLOSED EMBODIMENTS

Figure 1A:
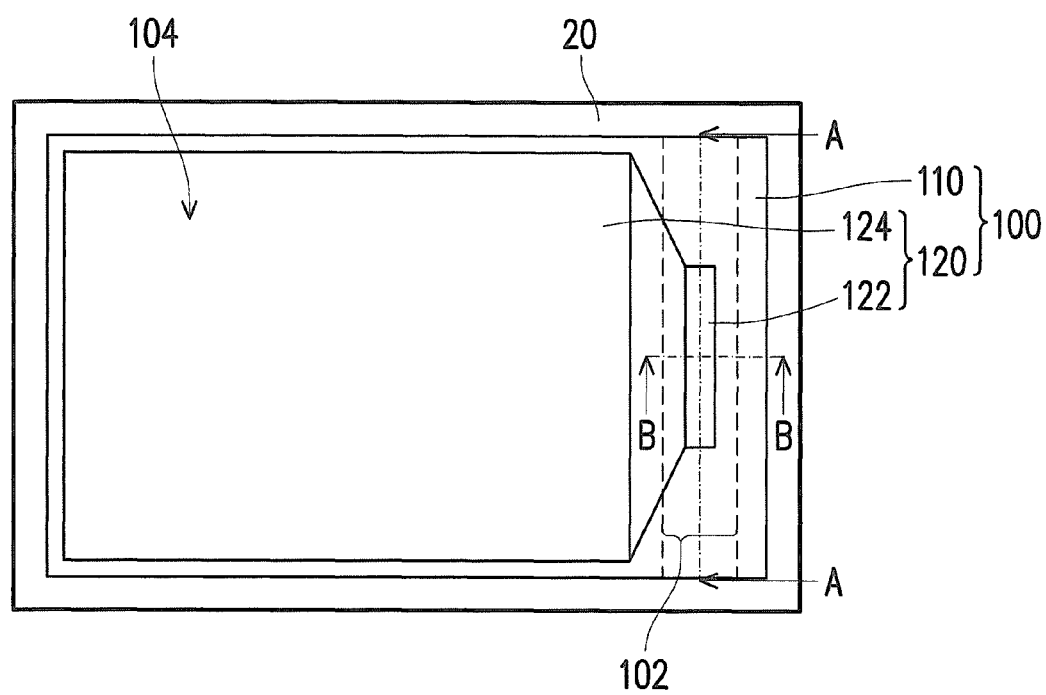
FIG. 1A is a top view of a step of a fabrication method of a flexible device of the first embodiment of the disclosure.
Figure 1B:
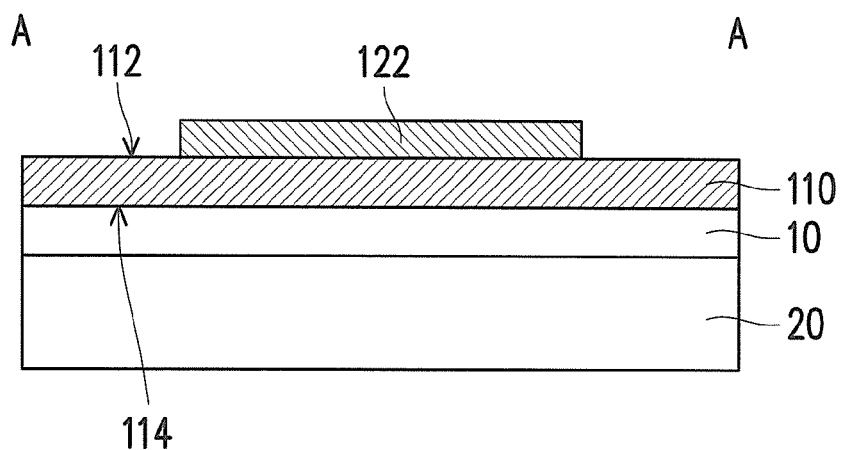
FIG. 1B is a cross-sectional view along line A-A of FIG. 1A.
Figure 1C:
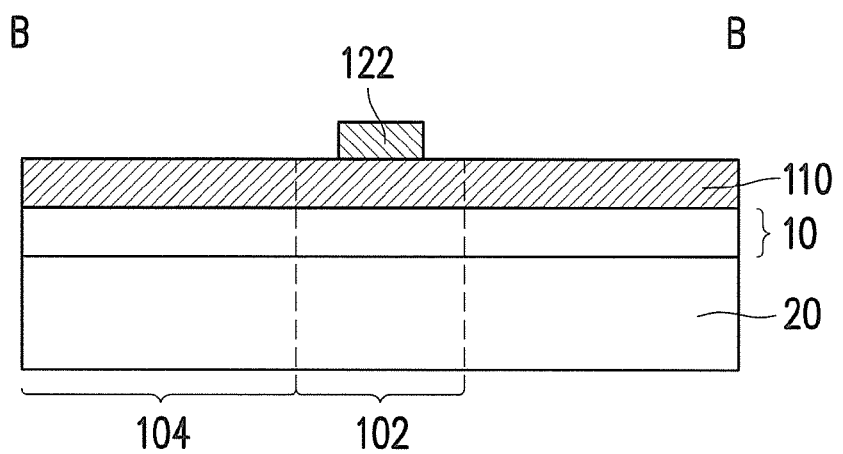
FIG. 1C is a cross-sectional view along line B-B of FIG. 1A.

FIG. 1A is a top view of a step of a fabrication method of a flexible device of the first embodiment of the disclosure, FIG. 1B is a cross-sectional view along line A-A of FIG. 1A, and FIG. 1C is a cross-sectional view along line B-B of FIG. 1A. Referring to FIG. 1A to FIG. 1C, a flexible substrate 110 may be temporarily adhered on a carrier 20 via a release layer 10, wherein the flexible substrate 110 has a first surface 112 and a second surface 114 opposite to each other, and the second surface 114 is in contact with the release layer 10. The material of the flexible substrate 110 is, for instance, a flexible material such as polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN), or polyetherimide (PEI). The flexible substrate 110 may also have a gas barrier layer. Using PI as example, such type of flexible material may be first coated in liquid state on the carrier 20 on which the release layer 10 is formed, and then a curing step is performed to form the flexible substrate 110, wherein the curing step may include a photocuring step, a thermal curing step, or other steps. In other embodiments, the PI material is fabricated into a thin-film flexible substrate 110, and in the present step, the flexible substrate 110 is temporarily adhered on the carrier 20 via the release layer 10. Moreover, since the release layer 10 is used to temporarily adhere the flexible substrate 110 on the carrier 20, the adhesion of the release layer 10 does not need to be very strong. In other words, the flexible substrate 110 may be removed from the release layer 10 in a subsequent fabrication step.

As shown in FIG. 1A to FIG. 1C, at least one element 120 is formed on the first surface 112 of the flexible substrate 110 to constitute a flexible device 100. In the present embodiment, the element 120 includes a rigid element 122 and a functional element 124, wherein the stiffness of the rigid element 122 is greater than that of the flexible substrate 110 and also greater than that of the functional element 124. Therefore, the flexible device 100 may be divided into a first area 102 and a second area 104, wherein the rigid element 122 is located in the first area 102 and the functional element 124 is located in the second area 104. Since the rigid element 122 is disposed in the first area 102, the stiffness of the flexible device 100 in the first area 102 is greater than the stiffness of the flexible device 100 in the second area 104.

In an embodiment, the rigid element 122 may be, for instance, a driving chip, and the functional element 124 may be, for instance, an organic light-emitting element, an inorganic light-emitting element, a sensing element, a display element, or a combination thereof. In other embodiments, the rigid element 122 may be an electrode, and the functional element 124 may be a battery element. In these embodiments, the rigid element 122 may be electrically connected to the functional element 124. Moreover, the rigid element 122 may be a relatively stiff member in the device, such as a seal or a lateral barrier layer, and the rigid element 122 may be disposed in the periphery of the functional element 124. The so-called stiffness may substantially be comprehensively determined via, for instance, the thickness and the Young's modulus of each layer of the element.

In general, by temporarily adhering the flexible substrate 110 on the carrier 20, desired accuracy and yield may be retained in the fabrication process of the element 120. After the needed elements 120 are all fabricated on the flexible substrate 110, the entire flexible device 100 needs to be removed from the carrier 20 so as to complete the independent flexible device 100. The adhesion provided by the release layer 10 does not have to be as strong as the average permanent adhesive layer, and therefore the flexible substrate 110 may be removed from the carrier 20 by only applying a sufficient peel force. However, when the portion to be peeled has greater stiffness or worse flexibility, the peel force needed to remove the flexible substrate 110 from the carrier 20 is significantly increased. For instance, in an embodiment, when the rigid element 122 is a packaged driving chip and the functional element 124 is an organic light-emitting element, a release force of about 3.867 kg is needed to separate the flexible substrate 110 of the location of the rigid element 122 (such as the first area 102 of the present embodiment) and the carrier 20, and a release force of less than 0.15 kg is needed to separate the other portions (such as the second area 104 of the present embodiment) from the carrier 20. Such a release force is likely to cause damage to members on the flexible substrate 110, such as wires fabricated on the flexible substrate 110 or the flexible substrate 110 itself which may break as a result, thus causing poor production yield.

Figure 2A:
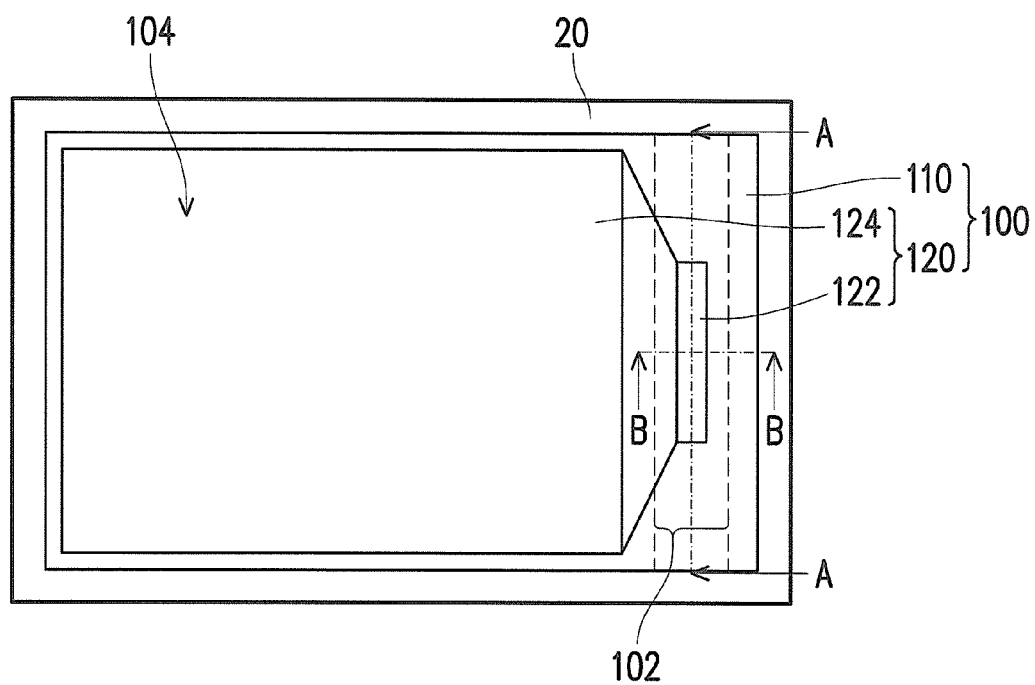
FIG. 2A is a top view of a step of a fabrication method of a flexible device of the first embodiment of the disclosure.
Figure 2B:
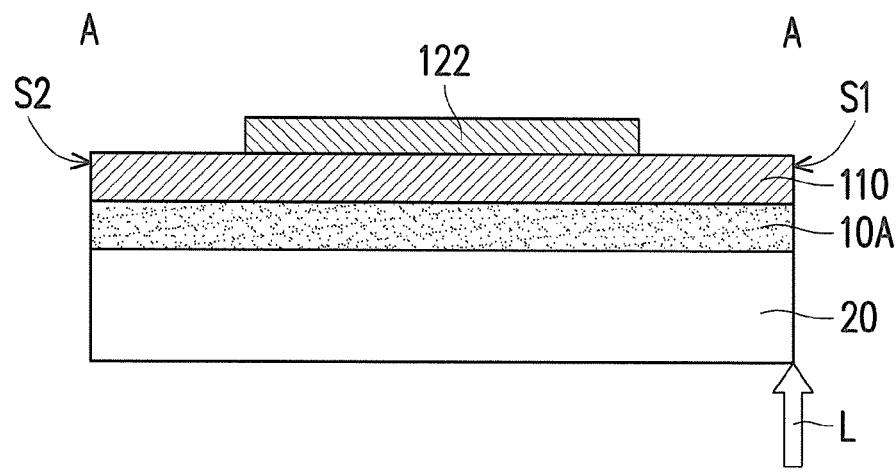
FIG. 2B is a cross-sectional view along line A-A of FIG. 2A.
Figure 2C:
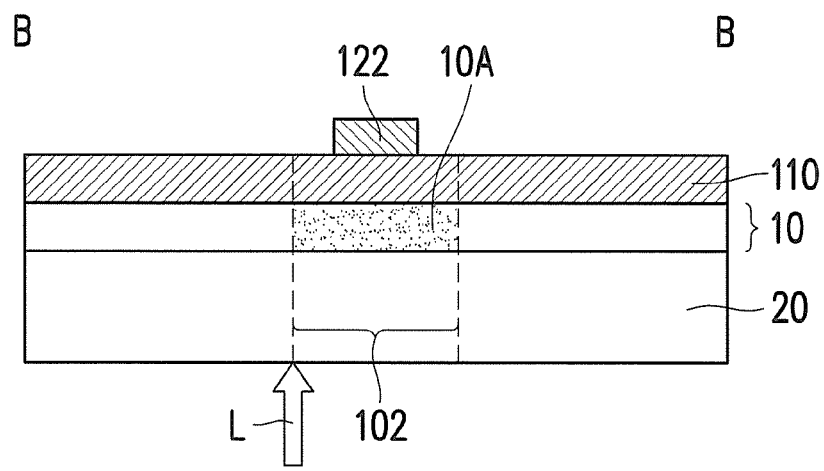
FIG. 2C is a cross-sectional view along line B-B of FIG. 2A.

In the present embodiment, before the flexible device 100 and the carrier 20 are separated, the following steps may be performed. FIG. 2A is a top view of a step of a fabrication method of a flexible device of the first embodiment of the disclosure, FIG. 2B is a cross-sectional view along line A-A of FIG. 2A, and FIG. 2C is a cross-sectional view along line B-B of FIG. 2A. Referring to FIG. 2A to FIG. 2C at the same time, a laser beam L is for instance irradiated from one side of the carrier 20 toward the release layer 10 located in the first area 102, and the irradiation path of the laser beam L falls in the first area 102. At this point, the release layer 10 irradiated by the laser beam L is decomposed or modified and converted into a release layer 10A. In the present embodiment, the path direction of the laser beam L is, for instance, from a first side S1 of the flexible substrate 110 toward a second side S2 of the flexible substrate 110, such that the release layer 10A is continuously distributed from the first side S1 to the second side S2, and the first side S1 and the second side S2 are opposite sides.

Figure 3A:
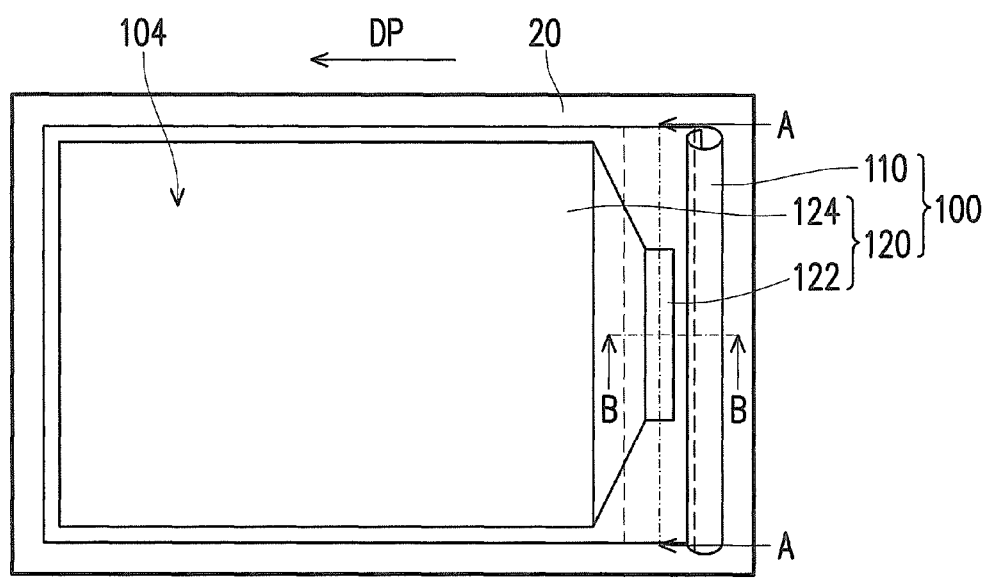
FIG. 3A is a top view of a step of a fabrication method of a flexible device of the first embodiment of the disclosure.
Figure 3B:
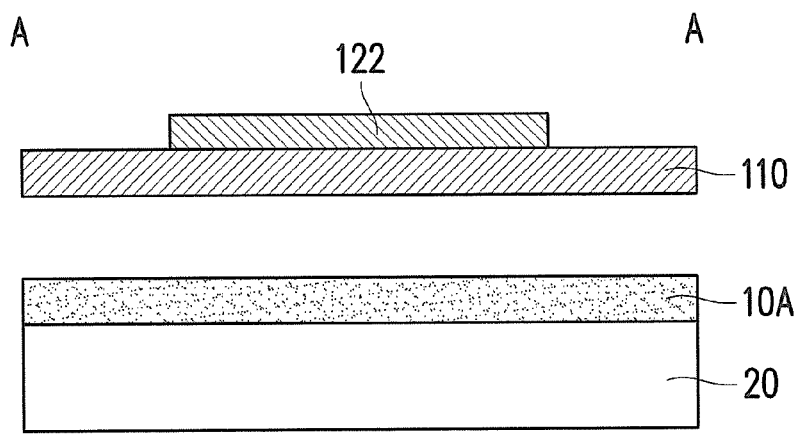
FIG. 3B is a cross-sectional view along line A-A of FIG. 3A.
Figure 3C:
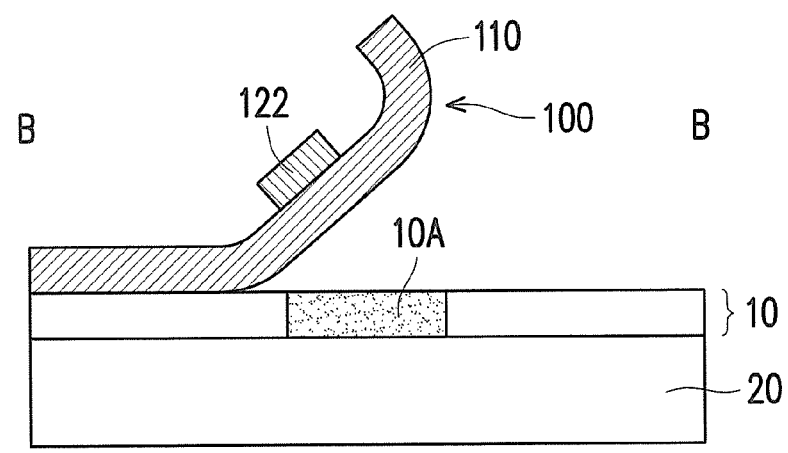
FIG. 3C is a cross-sectional view along line B-B of FIG. 3A.

FIG. 3A is a top view of a step of a fabrication method of a flexible device of the first embodiment of the disclosure, FIG. 3B is a cross-sectional view along line A-A of FIG. 3A, and FIG. 3C is a cross-sectional view along line B-B of FIG. 3A. Referring to FIG. 3A to FIG. 3C at the same time, after the irradiation of the laser beam L is conducted, the flexible device 100 is removed from the carrier 20, such that the flexible substrate 110 and the carrier 20 are separated. Here, the step of removing the flexible device 100 may include applying a peel force at one side of the flexible substrate 110 and peeling the flexible substrate 110 from the carrier 20 along a peeling direction DP.

In the step of FIG. 2A, the adhesion of the release layer 10A is damaged and is reduced when comparing with the release layer 10 without being irradiated by the laser beam L. Therefore, in the step of FIG. 3A, the peel force does not need to be significantly increased during the removal process of the first area 102 in order to separate the flexible substrate 110 of the first area 102 and the carrier 20. In an embodiment, when the rigid element 122 is a packaged driving chip and the functional element 124 is an organic light-emitting element, and the release layer 10 is converted to the release layer 10A via the processing steps of FIG. 2A to FIG. 2C, about 0.187 kg of peel force is needed to separate the flexible substrate 110 of the location of the rigid element 122 (such as the first area 102 of the present embodiment) and the carrier 20, which is a lot less than the peel force of 3.867 kg needed before the release layer 10 is processed. Therefore, in the present embodiment, members on the flexible substrate 110 are not readily damaged during the peeling process of the first area 102 from the carrier 20, such that the production yield of the flexible device 100 may be increased.

Figure 4A:
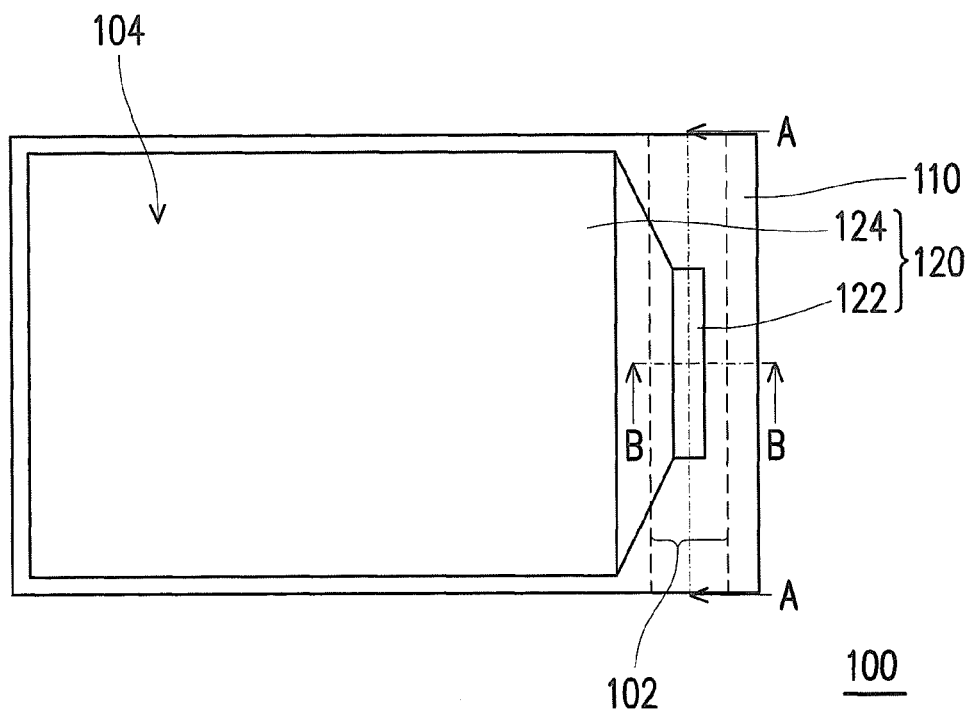
FIG. 4A is a top view of a flexible device of the first embodiment of the disclosure.
Figure 4B:
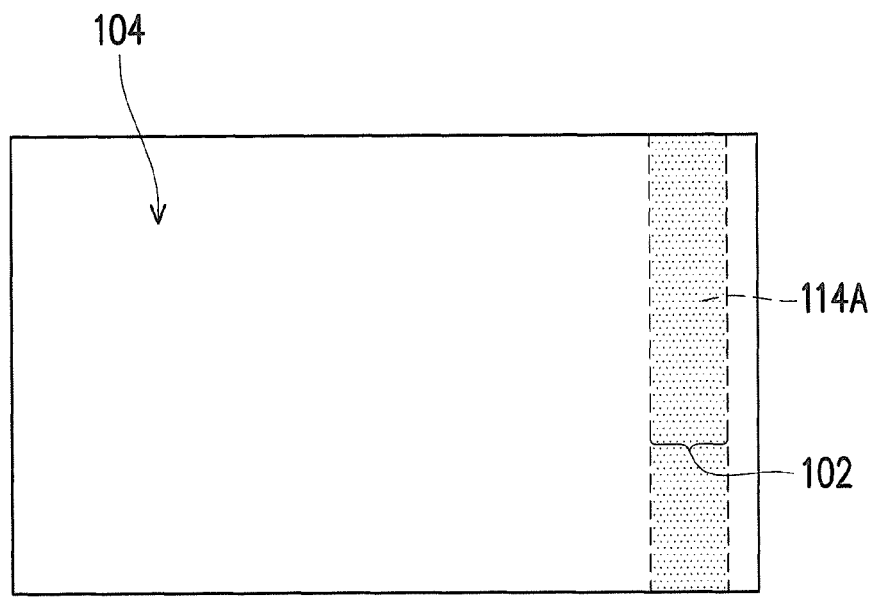
FIG. 4B is a top view of a flexible device of the first embodiment of the disclosure.
Figure 4C:
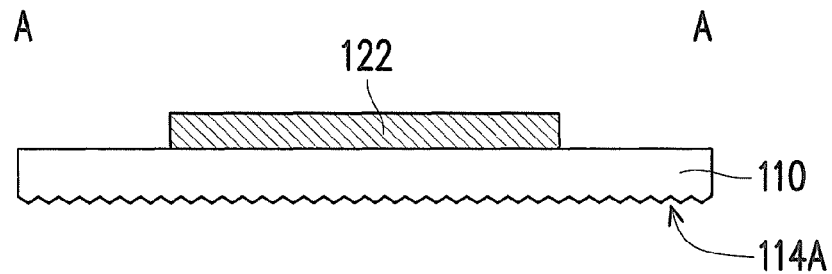
FIG. 4C is a cross-sectional view along line A-A of FIG. 4A.
Figure 4D:
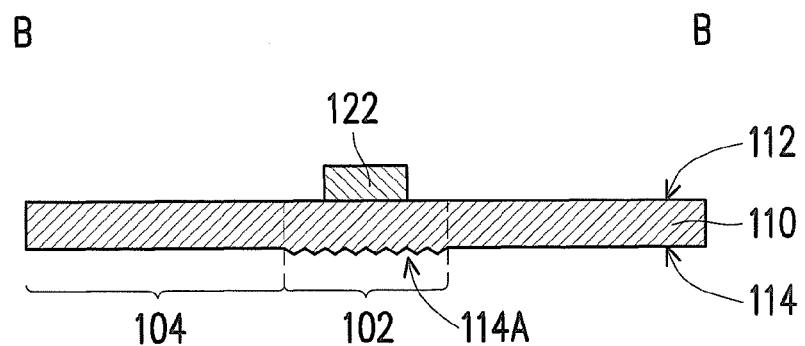
FIG. 4D is a cross-sectional view along line B-B of FIG. 4A.

FIG. 4A is a top view of a flexible device of the first embodiment of the disclosure, FIG. 4B is a top view of a flexible device of the first embodiment of the disclosure, FIG. 4C is a cross-sectional view along line A-A of FIG. 4A, and FIG. 4D is a cross-sectional view along line B-B of FIG. 4A. Referring to FIG. 4A to FIG. 4D at the same time, the flexible device 100 fabricated via the above steps has a first area 102 and a second area 104, wherein the stiffness of the first area 102 is greater than the stiffness of the second area 104. Moreover, the flexible device 100 may include a flexible substrate 110 and an element 120 disposed on the flexible substrate 110, wherein the element 120 may include a rigid element 122 and a functional element 124. The flexible substrate 110 includes a first surface 112 and a second surface 114 opposite to each other. Moreover, the rigid element 122 is disposed on the first surface 112 of the flexible substrate 110 and located in the first area 102, wherein the stiffness of the rigid element 122 is greater than the stiffness of the flexible substrate 110 and a projection area of a coarse structure 114A on the flexible substrate 110 overlaps the rigid element 122.

It may be known from FIG. 4B to FIG. 4D that, the second surface 114 of the flexible substrate 110 has a coarse structure 114A in the first area 102, such that the surface roughness of the second surface 114 in the first area 102 is greater than the surface roughness of the second surface 114 in the second area 104. The coarse structure 114A may be formed by, for instance, the laser irradiation step of FIG. 2A to FIG. 2C.

According to the above steps, the laser irradiation step is performed in the first area 102, and therefore the coarse structure 114A also falls in the first area 102. The laser irradiation step is performed to reduce the adhesion of the release layer 10 where the rigid element 122 is located, and therefore the irradiation range of the laser beam overlaps the disposition area of the rigid element 122. Moreover, in the present embodiment, the flexible device 100 further includes a functional element 124 disposed in the second area 104, and the stiffness of the rigid element 122 is greater than the stiffness of the functional element 124, but in other embodiments, the functional element 124 may also be optionally omitted. In other words, the flexible device 100 may include only the flexible substrate 110 and the rigid element 122.

Figure 5:
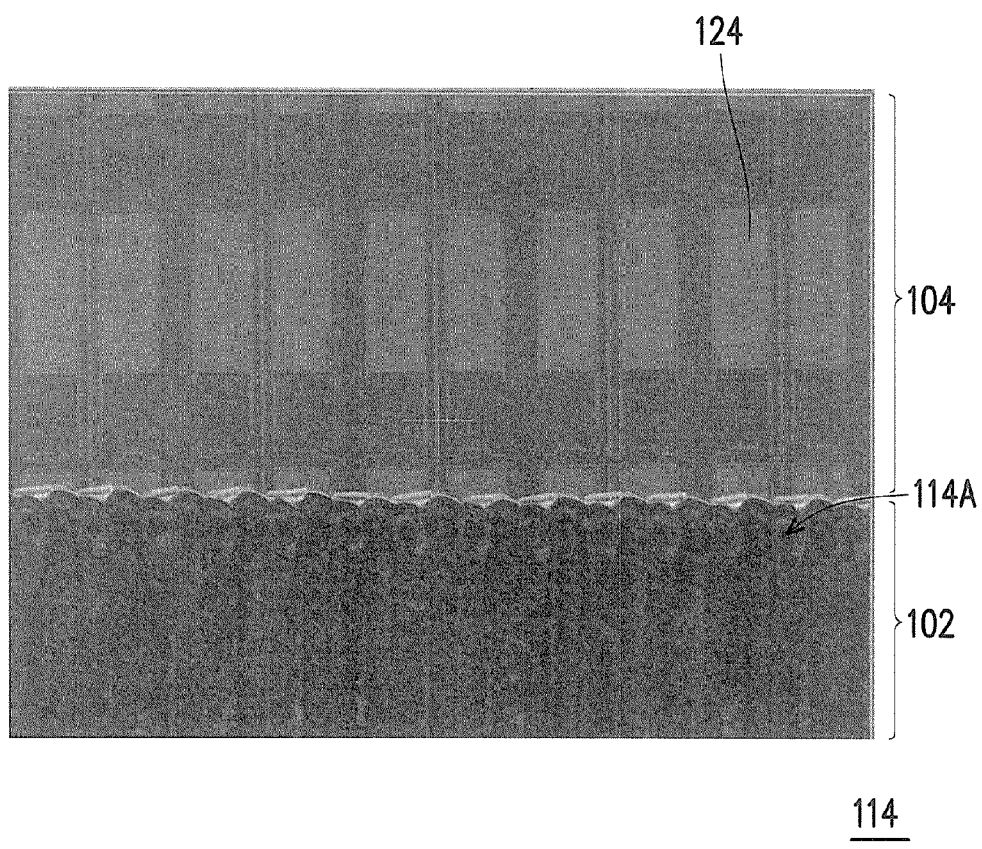
FIG. 5 is a micrograph of a second surface of a flexible substrate of the first embodiment of the disclosure.

FIG. 5 is a micrograph of a second surface of a flexible substrate of the first embodiment of the disclosure. It may be known from FIG. 5 that, the second surface 114 has a coarse structure 114A in the first area 102, and the second surface 114 appears smooth or translucent in the second area 104, such that the functional element 124 used as a display element is observed. Here, the functional element 124 used as a display element is exemplified by an organic light-emitting display pixel, but is not limited thereto.

It may be known from the first embodiment that, in the laser irradiation step, the release layer material is decomposed to reduce the adhesion of the release layer 10 in the first area 102, thus increasing the production yield of the flexible device 100. However, in the case that the decomposition of the release layer material generates gas, if the gas generated in the process may not be released or is excessively accumulated, deformation to the first area 102 may readily occur due to the pressure generated by the gas. Therefore, in the first embodiment, as shown in FIG. 2B, the irradiation path of the laser beam L starts from the first side S1 of the flexible substrate 110 and travels toward the second side S2 of the flexible substrate 110, and the first side S1 and the second side S2 are opposite sides. However, the fabrication method of the flexible device 100 is not limited thereto.

Figure 6A:
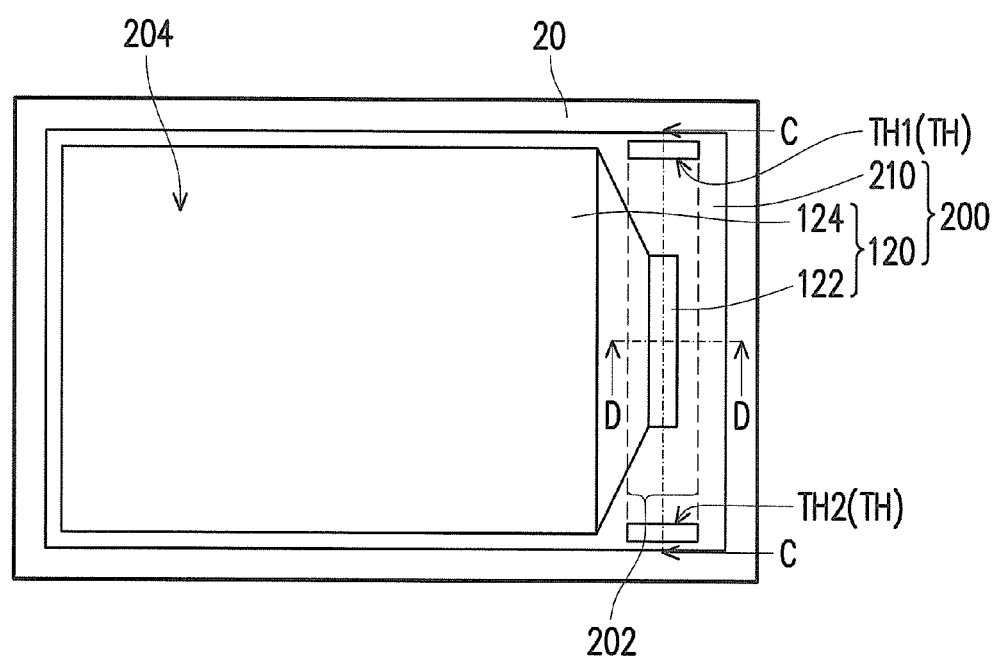
FIG. 6A is a top view of a step of a fabrication method of a flexible device of the second embodiment of the disclosure.
Figure 6B:
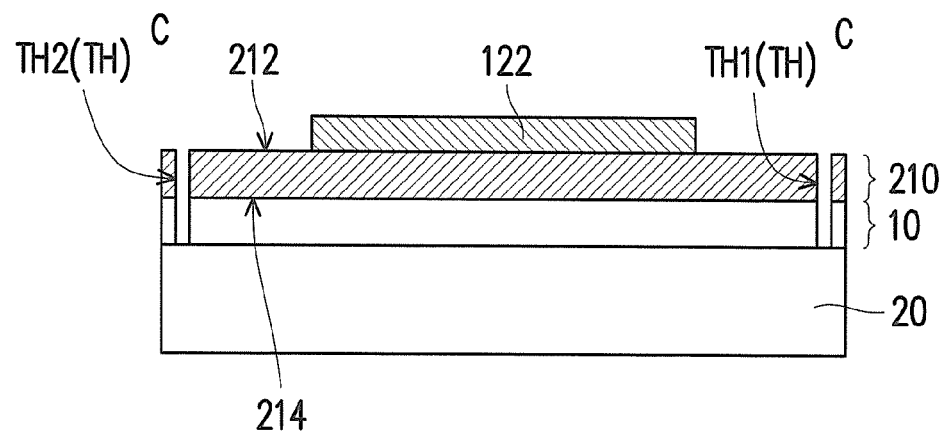
FIG. 6B is a cross-sectional view along line C-C of FIG. 6A.
Figure 6C:
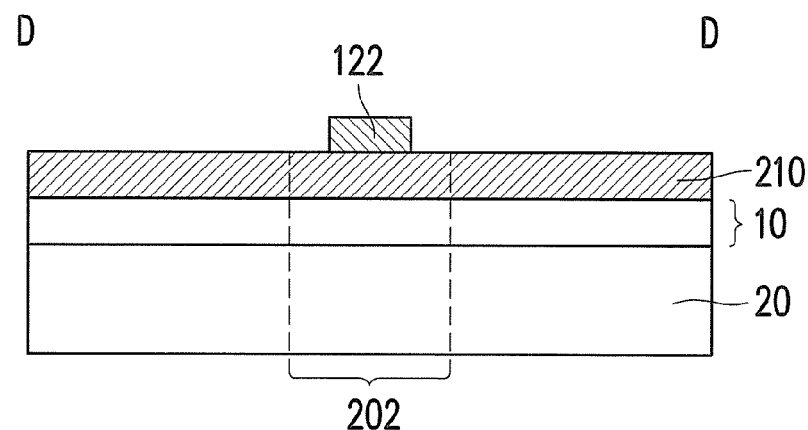
FIG. 6C is a cross-sectional view along line D-D of FIG. 6A.

FIG. 6A is a top view of a step of a fabrication method of a flexible device of the second embodiment of the disclosure, FIG. 6B is a cross-sectional view along line C-C of FIG. 6A, and FIG. 6C is a cross-sectional view along line D-D of FIG. 6A. In the present embodiment, the flexible substrate 110 may be temporarily adhered on the carrier 20 via the release layer 10 according to the steps of FIG. 1A to FIG. 3A, and the element 120 is fabricated on the flexible substrate 110 when the flexible substrate 110 is adhered on the carrier 20. Then, referring to FIG. 6A to FIG. 6C, a processing step is performed to fabricate at least one via TH on the flexible substrate 110 to form a flexible substrate 210. The processing step of forming the via TH may be, for instance, cutting with a round blade, laser cutting, or punching, but is not limited thereto. Here, the number of the vias TH (via TH1 and via TH2) is two, but this is only exemplary. In other embodiments, the number of the vias TH may be one or more than two.

In the present embodiment, the rigid element 122 is located between the via TH1 and the via TH2, and the via TH1 and the via TH2 respectively define two ends of a first area 202. Therefore, the area outside of the first area 202 may be regarded as a second area 204. The entire rigid element 122 falls within the first area 202. Moreover, the via TH1 and the via TH2 may pass through the flexible substrate 210 to expose the release layer 10, or pass through the flexible substrate 210 and the release layer 10 at the same time and expose the carrier 20, and the latter is exemplified in the following figures.

Figure 7A:
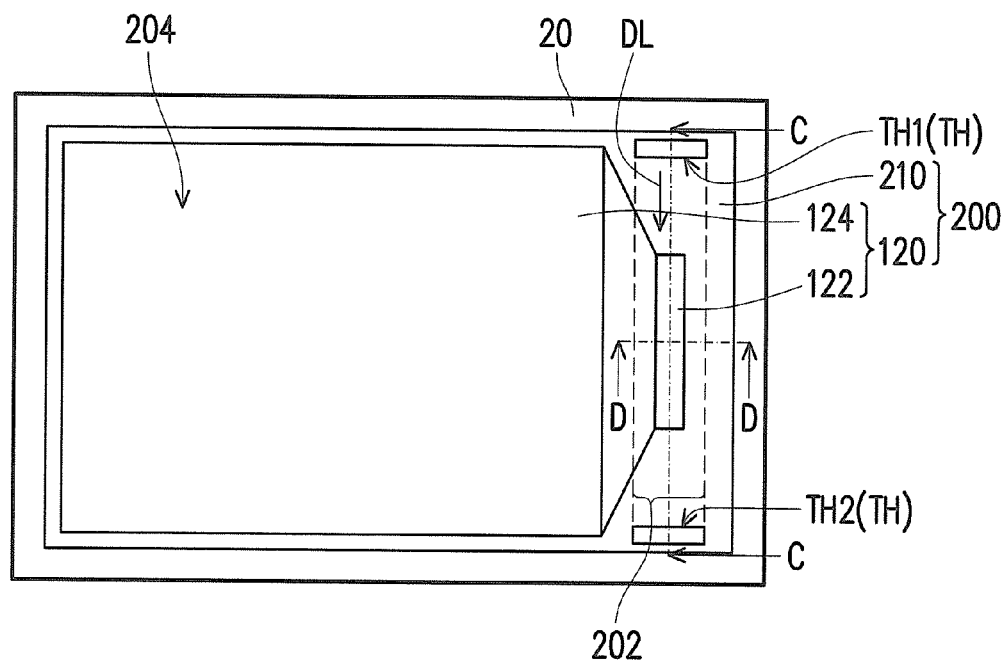
FIG. 7A is a top view of a step of a fabrication method of a flexible device of the second embodiment of the disclosure.
Figure 7B:
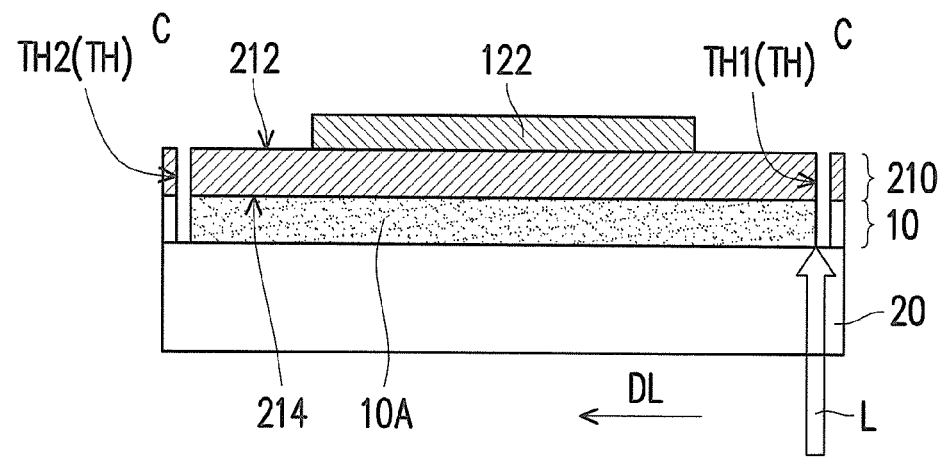
FIG. 7B is a cross-sectional view along line C-C of FIG. 7A.
Figure 7C:
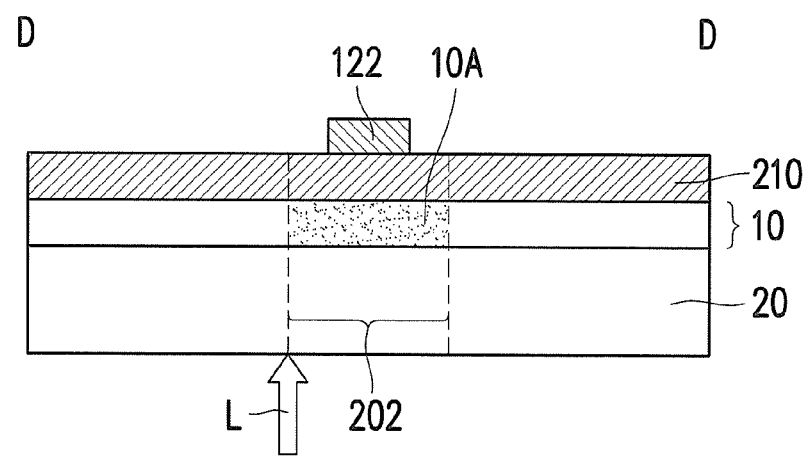
FIG. 7C is a cross-sectional view along line D-D of FIG. 7A.

FIG. 7A is a top view of a step of a fabrication method of a flexible device of the second embodiment of the disclosure, FIG. 7B is a cross-sectional view along line C-C of FIG. 7A, and FIG. 7C is a cross-sectional view along line D-D of FIG. 7A. The steps represented in FIG. 7A to FIG. 7C include, for instance, irradiating a laser beam L from one side of the carrier 20 toward the release layer 10 located in the first area 202 to form a release layer 10A in the first area 202. In the present embodiment, the irradiation path of the laser beam L starts at the location of the first via TH1 and ends at the location of the second via TH2. In other words, the laser beam L moves along a moving direction DL.

Figure 7D:
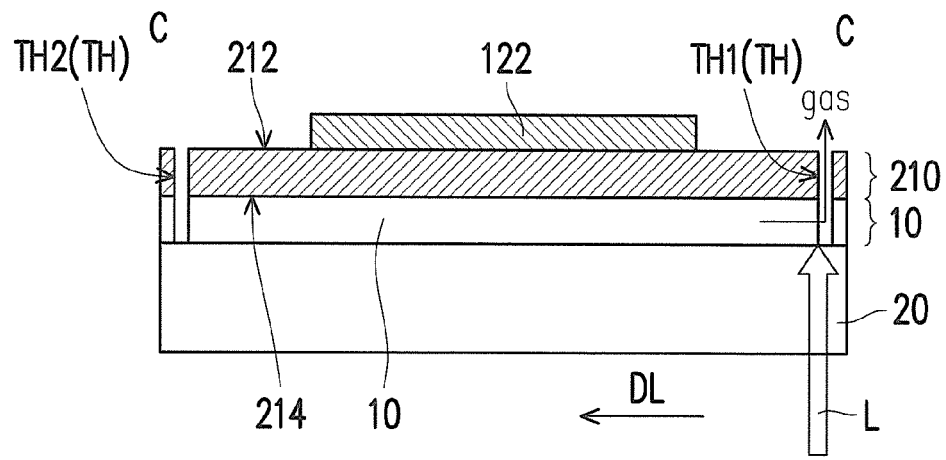
FIG. 7D to FIG. 7F are the irradiation process of a laser beam L along an irradiation path.
Figure 7E:
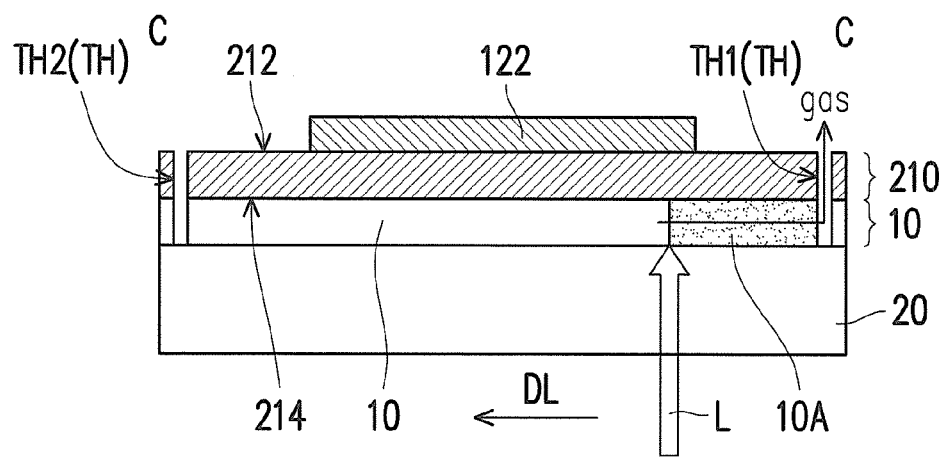
Figure 7F:
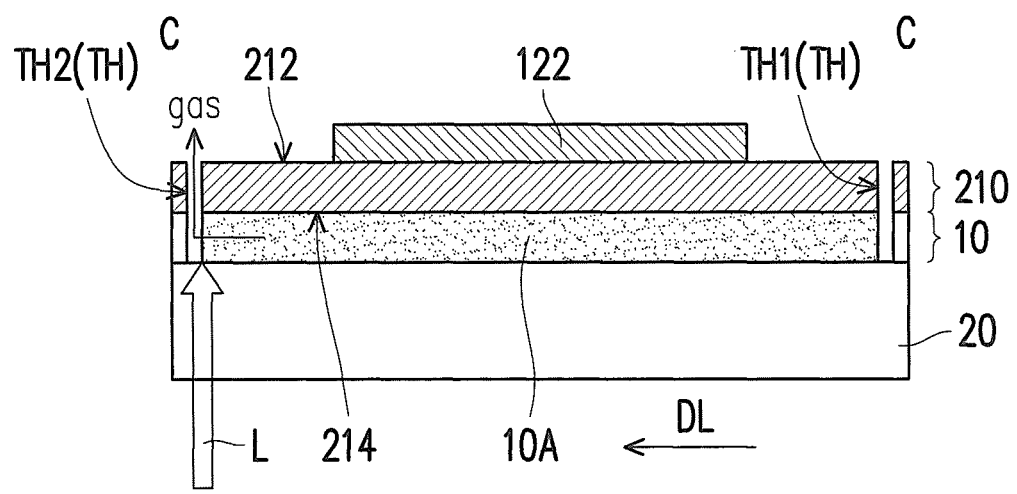

FIG. 7D to FIG. 7F are the irradiation process of a laser beam L along an irradiation path. It may be known from FIG. 7D to FIG. 7F that, since the irradiation path of the laser beam L starts at the location of the first via TH1 and travels toward the second via TH2, when the material of the release layer 10 is decomposed by laser energy, the generated gas may be dissipated from the first via TH1 (as shown in FIG. 7D and FIG. 7E). Moreover, when the irradiation point of the laser beam L is close to the second via TH2, the generated gas may be dissipated from the second via TH2 and the first via TH1. Therefore, accumulation of gas does not readily occur at the location of the release layer 10A, such that the flexible substrate 210 is not deformed or the flexible device 200 is not damaged. In other words, the via TH1 may facilitate the dissipation of gas generated in the fabrication process, thus facilitating increase in production yield.

Figure 8A:
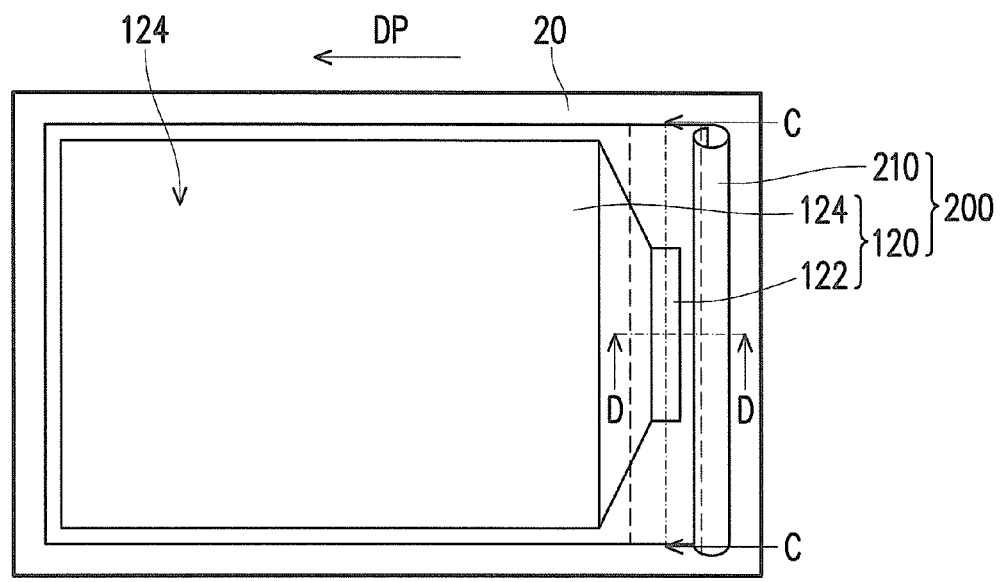
FIG. 8A is a top view of a step of a fabrication method of a flexible device of the second embodiment of the disclosure.
Figure 8B:
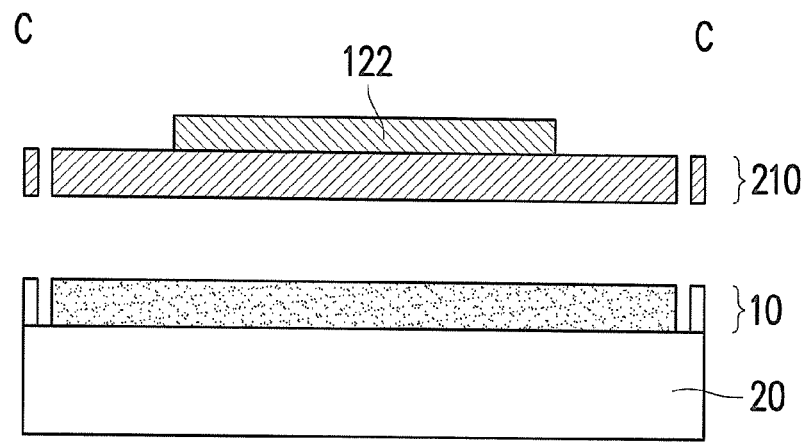
FIG. 8B is a cross-sectional view along line C-C of FIG. 8A.
Figure 8C:
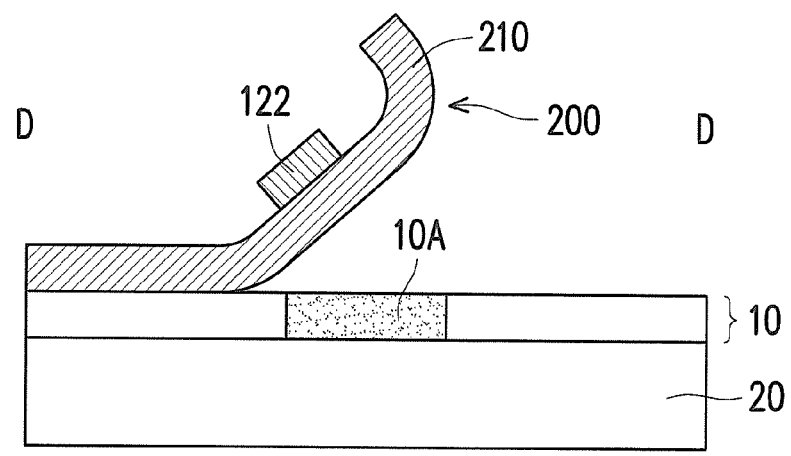
FIG. 8C is a cross-sectional view along line D-D of FIG. 8A.

FIG. 8A is a top view of a step of a fabrication method of a flexible device of the second embodiment of the disclosure, FIG. 8B is a cross-sectional view along line C-C of FIG. 8A, and FIG. 8C is a cross-sectional view along line D-D of FIG. 8A. The steps represented by FIG. 8A to FIG. 8C are similar to the steps of FIG. 3A to FIG. 3C, which include the removal of the flexible device 200 from the carrier 20. Specific steps of FIG. 8A to FIG. 8C are as described for FIG. 3A to FIG. 3C. In the first embodiment and the second embodiment, the flexible substrate 110 or 210 is separated from the carrier 20 along the peeling direction DP, that is, the flexible substrate 110 or 210 is separated from the carrier 20 from the side of the flexible substrate 110 or 210 closer to the rigid element 122 toward the opposite side. However, the peeling direction DP is not limited to the direction represented in the figure. In other embodiments, the flexible substrate 110 or 210 may also be separated from the carrier 20 along a direction opposite to the peeling direction DP, that is, the flexible substrate 110 or 210 may be separated from the carrier 20 from the side of the flexible substrate 110 or 210 farther from the rigid element 122 toward the opposite side.

Figure 9A:
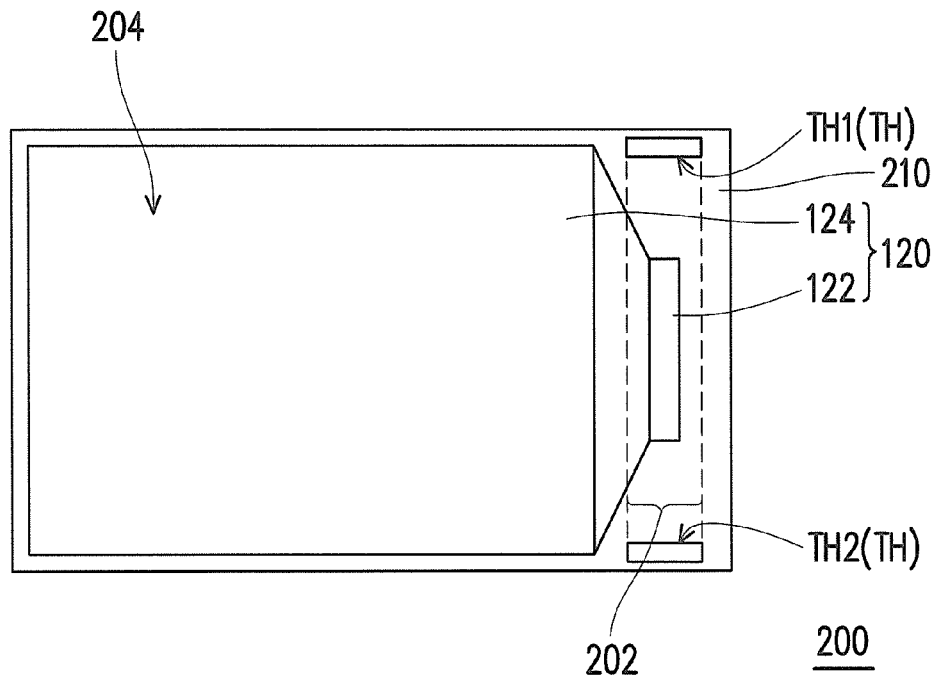
FIG. 9A is a top view of a flexible device of the second embodiment of the disclosure.
Figure 9B:
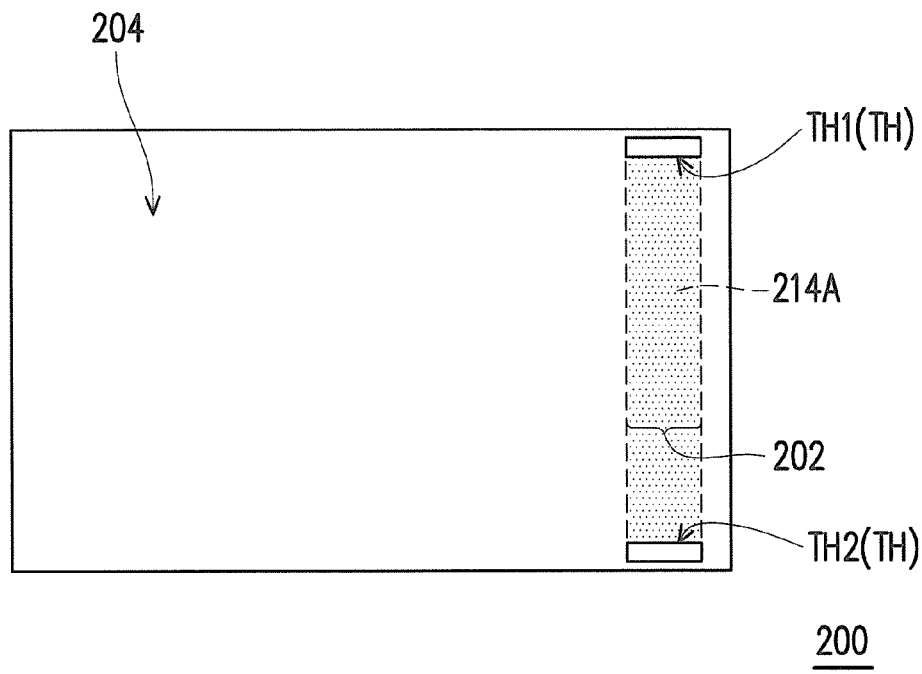
FIG. 9B is a top view of a flexible device of the second embodiment of the disclosure.

FIG. 9A is a top view of a flexible device of the second embodiment of the disclosure, and FIG. 9B is a top view of a flexible device of the second embodiment of the disclosure. Referring to FIG. 9A and FIG. 9B, the flexible device 200 fabricated according to steps such as FIG. 6A to FIG. 8A may be substantially similar to the flexible device 100 of the first embodiment. The flexible device 200 has a first area 202 and a second area 204, wherein the stiffness of the first area 202 may be greater than the stiffness of the second area 204. Moreover, the flexible device 200 includes a flexible substrate 210 and an element 120 disposed on the flexible substrate 210, wherein the element 120 may include a rigid element 122 and a functional element 124. The flexible substrate 210 includes a first surface 212 (shown in FIG. 6B) and a second surface 214 (shown in FIG. 6B) opposite to each other, and has vias TH1 and TH2. Moreover, the rigid element 122 is disposed on the first surface 212 of the flexible substrate 210 and located in the first area 202, wherein the stiffness of the rigid element 122 may be greater than the stiffness of the flexible substrate 210. Moreover, the second surface 214 of the flexible substrate 210 has a coarse structure 214A in the first area 202 and a projection area of the coarse structure 214A on the flexible substrate 210 overlaps the area of the rigid element 122. In other words, the flexible substrate 210 has two vias TH1 and TH2. However, in other embodiments, the flexible substrate 210 may also only include one via TH, or more than two vias TH.

Figure 10A:
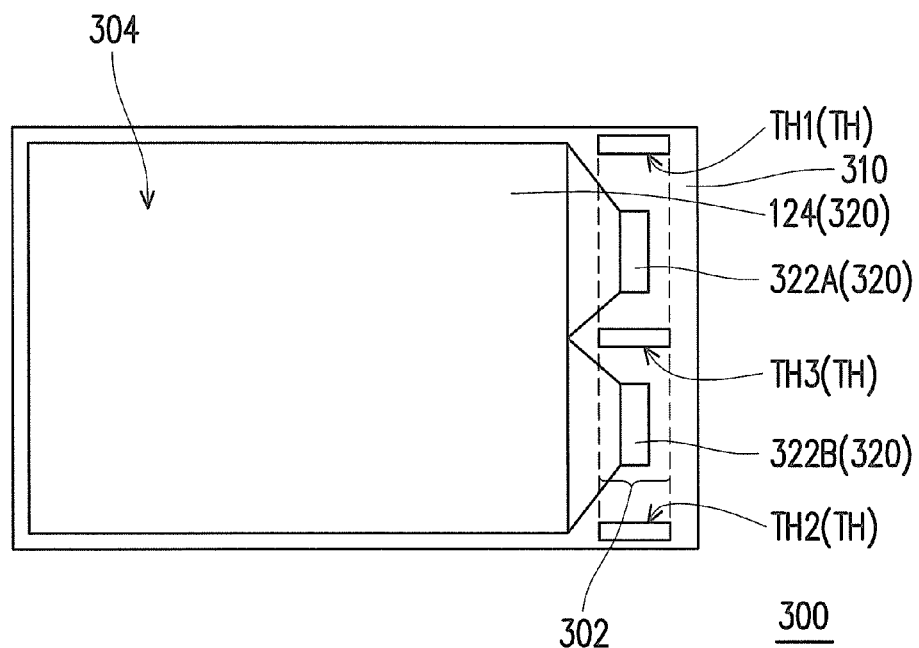
FIG. 10A is a top view of a flexible device of the third embodiment of the disclosure.
Figure 10B:
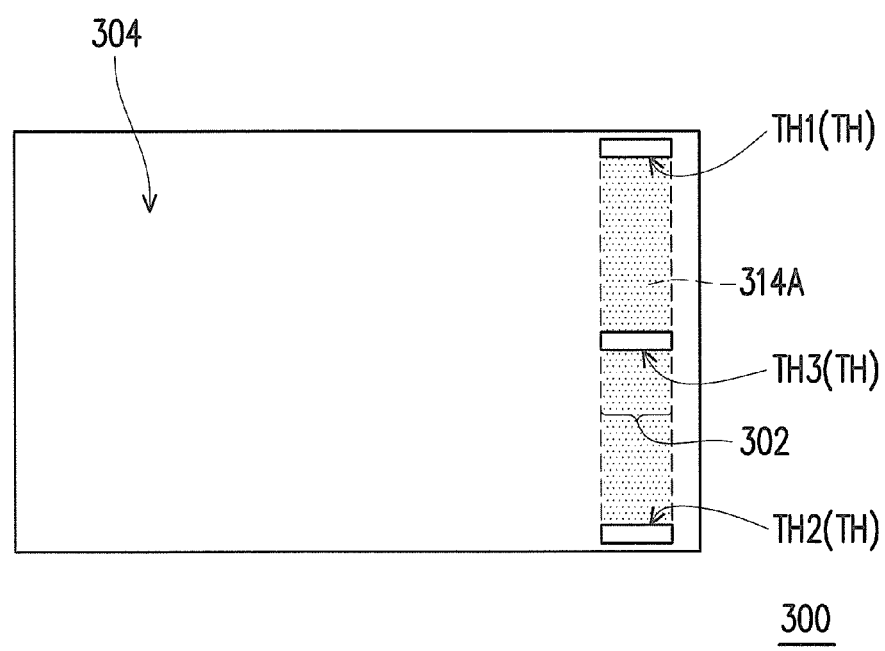
FIG. 10B is a top view of a flexible device of the third embodiment of the disclosure.

For instance, FIG. 10A is a top view of a flexible device of the third embodiment of the disclosure, and FIG. 10B is a top view of a flexible device of the third embodiment of the disclosure. Referring to FIG. 10A and FIG. 10B, a flexible device 300 may be substantially similar to the flexible device 100 of the first embodiment. The flexible device 300 has a first area 302 and a second area 304, wherein the stiffness of the first area 302 may be greater than the stiffness of the second area 304. Moreover, the flexible device 300 includes a flexible substrate 310 and an element 320 disposed on the flexible substrate 310, wherein the element 320 may include rigid elements 322A and 322B and a functional element 124. The flexible substrate 310 includes a first surface (first surface represented in FIG. 10A) and a second surface (second surface represented in FIG. 10B) opposite to each other, and has vias TH1, TH2, and TH3. Moreover, the rigid elements 322A and 322B are disposed on the first surface of the flexible substrate 310 and located in the first area 302, wherein the stiffness of each of the rigid elements 322A and 322B is greater than the stiffness of the flexible substrate 310. Moreover, when the flexible device 300 is fabricated and when the release layer is, for instance, irradiated via laser, the via TH3 may be located in the irradiation path of the laser beam or the irradiation path of the laser beam may pass through the via TH3. As a result, the second surface of the flexible substrate 310 has a coarse structure 314A in the first area 302, and a projection area of the coarse structure 314A on the flexible substrate overlaps the rigid elements 322A and 322B. In other words, the flexible substrate 310 has three vias TH1, TH2, and TH3, and the flexible substrate 310 has two rigid elements 322A and 322B. In the three vias TH1, TH2, and TH3, the vias TH1 and TH2 define two ends of the first area 302, and the via TH3 is located inside the first area 302. The rigid element 322A is located between the via TH1 and the via TH3, and the rigid element 322B is located between the via TH2 and the via TH3. Moreover, the rigid elements 322A and 322B may be packaged driving chips, but are not limited thereto.

Figure 11A:
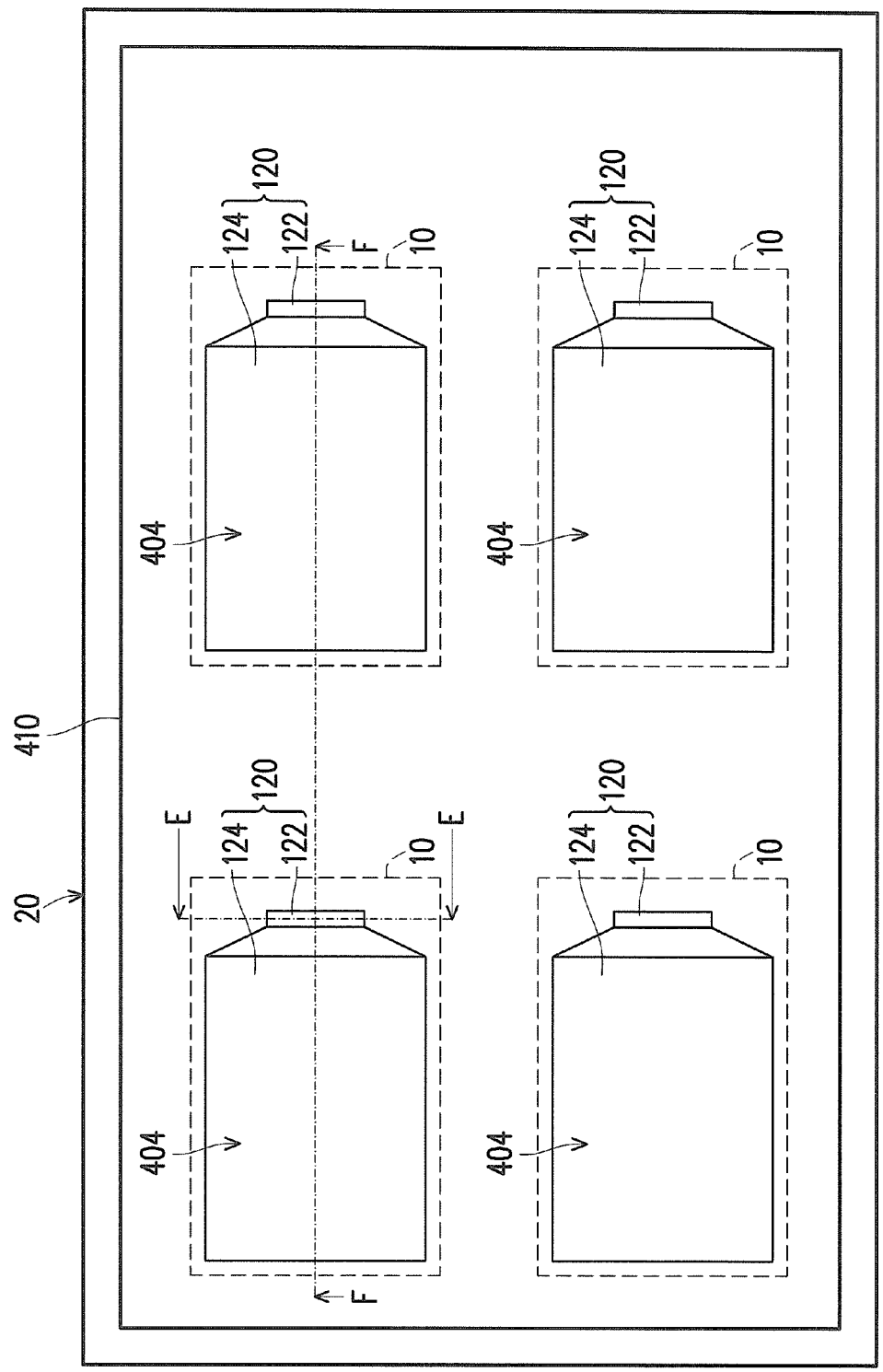
FIG. 11A is a top view of a step of a fabrication method of a flexible device of the fourth embodiment of the disclosure.
Figure 11B:
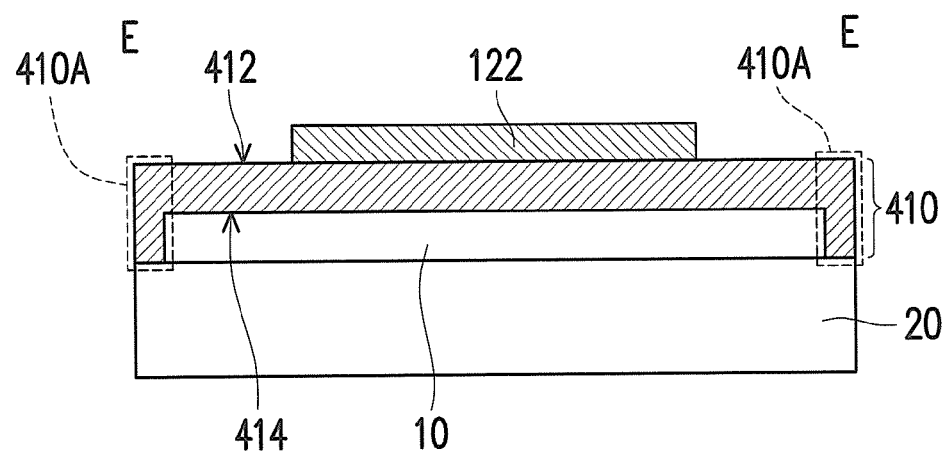
FIG. 11B is a cross-sectional view along line E-E of FIG. 11A.
Figure 11C:
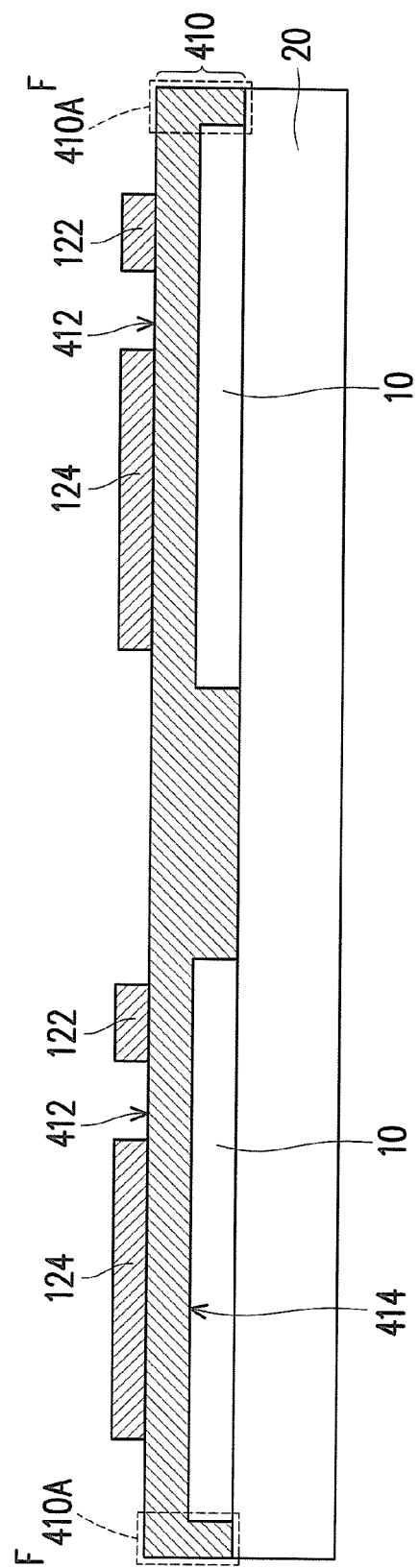
FIG. 11C is a cross-sectional view along line F-F of FIG. 11A.

FIG. 11A is a top view of a step of a fabrication method of a flexible device of the fourth embodiment of the disclosure, FIG. 11B is a cross-sectional view along line E-E of FIG. 11A, and FIG. 11C is a cross-sectional view along line F-F of FIG. 11A. Referring to FIG. 11A to FIG. 11C at the same time, the present step includes temporarily adhering a flexible substrate 410 on a carrier 20 via a release layer 10, wherein the area of the release layer 10 is less than the flexible substrate 410 such that the flexible substrate 410 is partially in contact with the carrier 20. Here, a portion 410A of the carrier 20 in contact with the flexible substrate 410 surrounds the release layer 10. The flexible substrate 410 has a first surface 412 and a second surface 414, and a portion of the second surface 414 is in contact with the release layer 10. Moreover, in the present step, at least one element 120 is also formed on the first surface 412 of the flexible substrate 410. Here, the fabrication method of the flexible substrate 410 is the same as the fabrication method of the flexible substrate 110 of FIG. 1A to FIG. 1C, and the fabrication, the type, and the location . . . etc. of the elements 120 are also as described in the first embodiment.

Figure 12A:
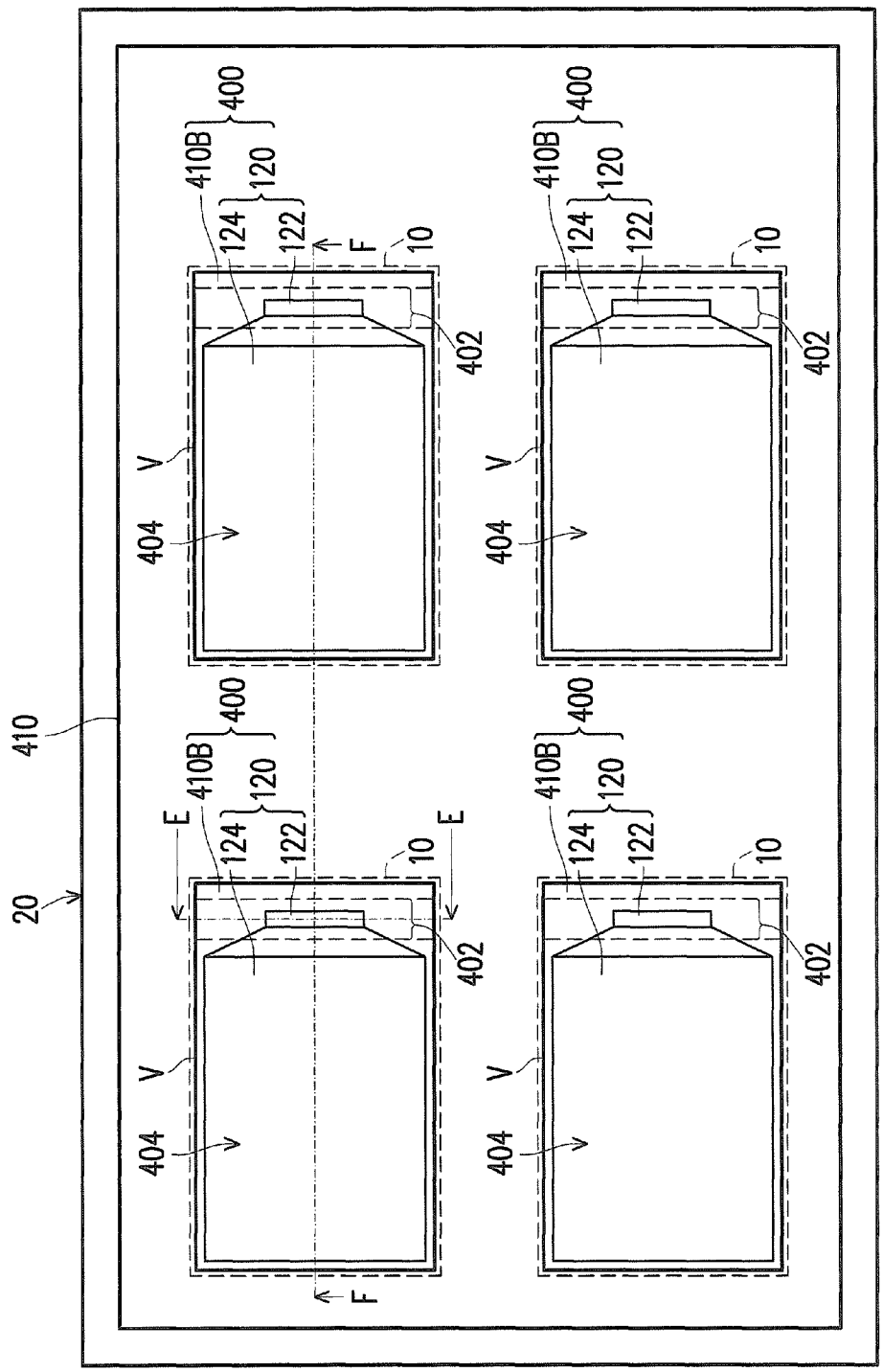
FIG. 12A is a top view of a step of a fabrication method of a flexible device of the fourth embodiment of the disclosure.
Figure 12B:
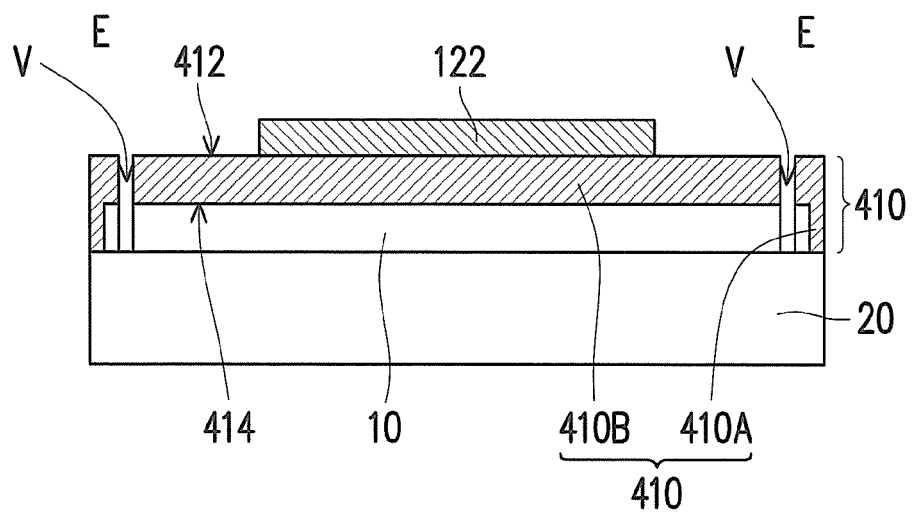
FIG. 12B is a cross-sectional view along line E-E of FIG. 12A.
Figure 12C:
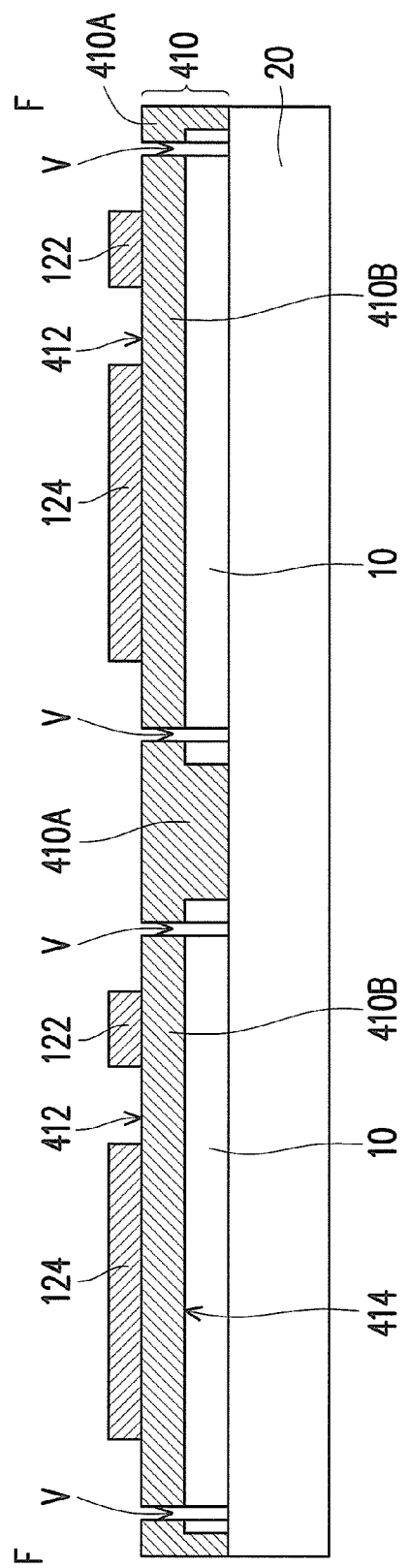
FIG. 12C is a cross-sectional view along line F-F of FIG. 12A.

FIG. 12A is a top view of a step of a fabrication method of a flexible device of the fourth embodiment of the disclosure, FIG. 12B is a cross-sectional view along line E-E of FIG. 12A, and FIG. 12C is a cross-sectional view along line F-F of FIG. 12A. Referring to FIG. 12A to FIG. 12C, a processing step is performed to cut the flexible substrate 410 along the periphery of the release layer 10 so as to form a circular cut opening V as shown in FIG. 12A, and the cut opening V exposes the release layer 10, or the cut opening V passes through the flexible substrate 410 and the release layer 10 at the same time and exposes the carrier 20 (FIG. 12B). Here, the flexible substrate 410 is cut into two portions separate from each other, one of the portions is a flexible substrate 410B to be removed and the other portion is the portion 410A in contact with the carrier 20. Moreover, in the present embodiment, the elements 120 are all fabricated on the flexible substrate 410B to form a flexible device 400.

In the present embodiment, the elements 120 include a rigid element 122 and a functional element 124, wherein the stiffness of the rigid element 122 may be greater than that of the functional element 124 and also greater than that of the flexible substrate 410B. Therefore, the flexible device 400 may have a first area 402 and a second area 404, and the rigid element 122 is located in the first area 402 such that the stiffness of the first area 402 is greater than that of the second area 404.

Figure 13A:
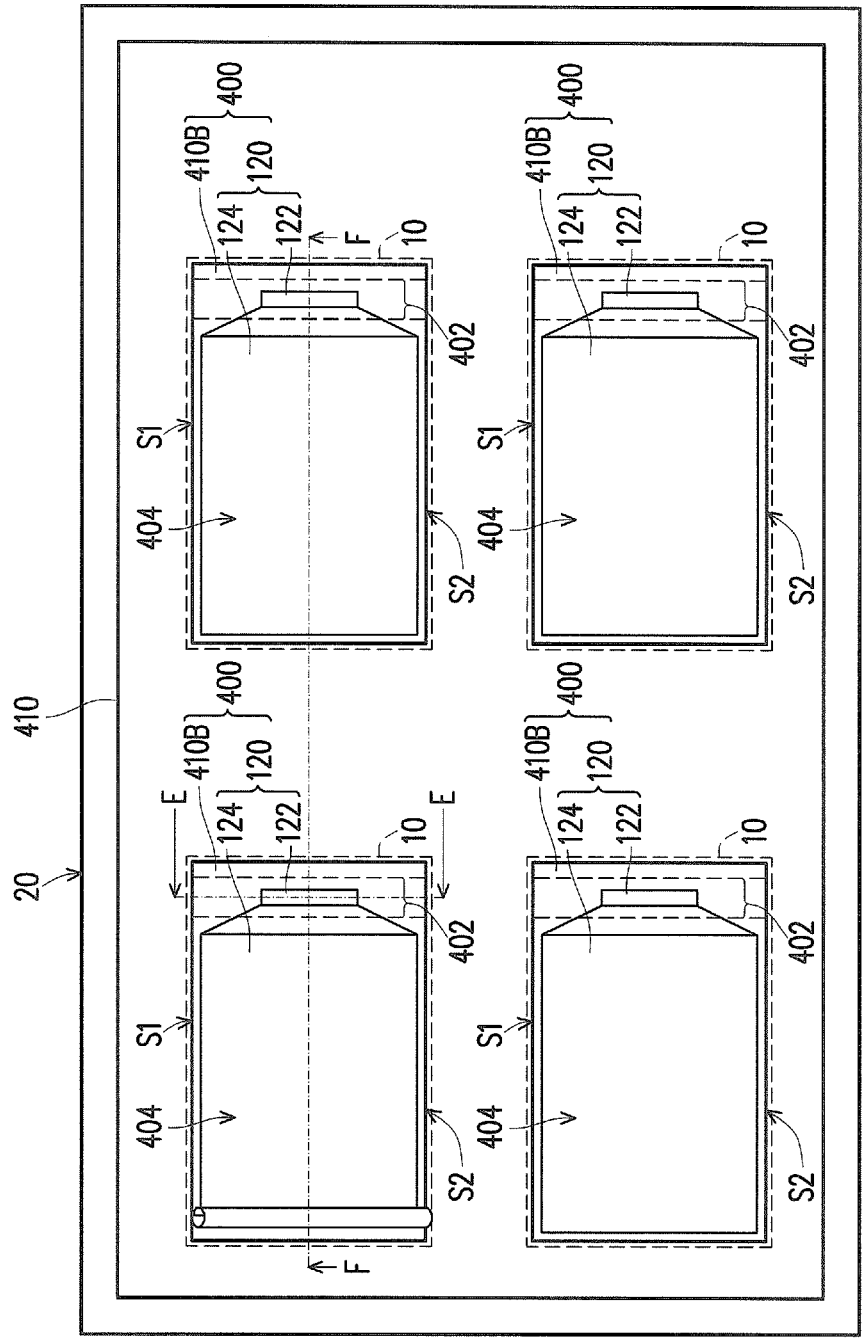
FIG. 13A is a top view of a step of a fabrication method of a flexible device of the fourth embodiment of the disclosure.
Figure 13B:
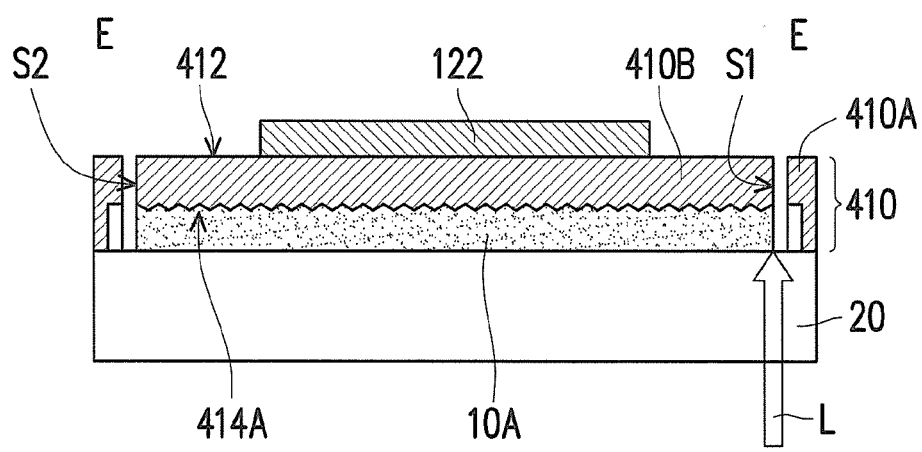
FIG. 13B is a cross-sectional view along line E-E of FIG. 13A.
Figure 13C:
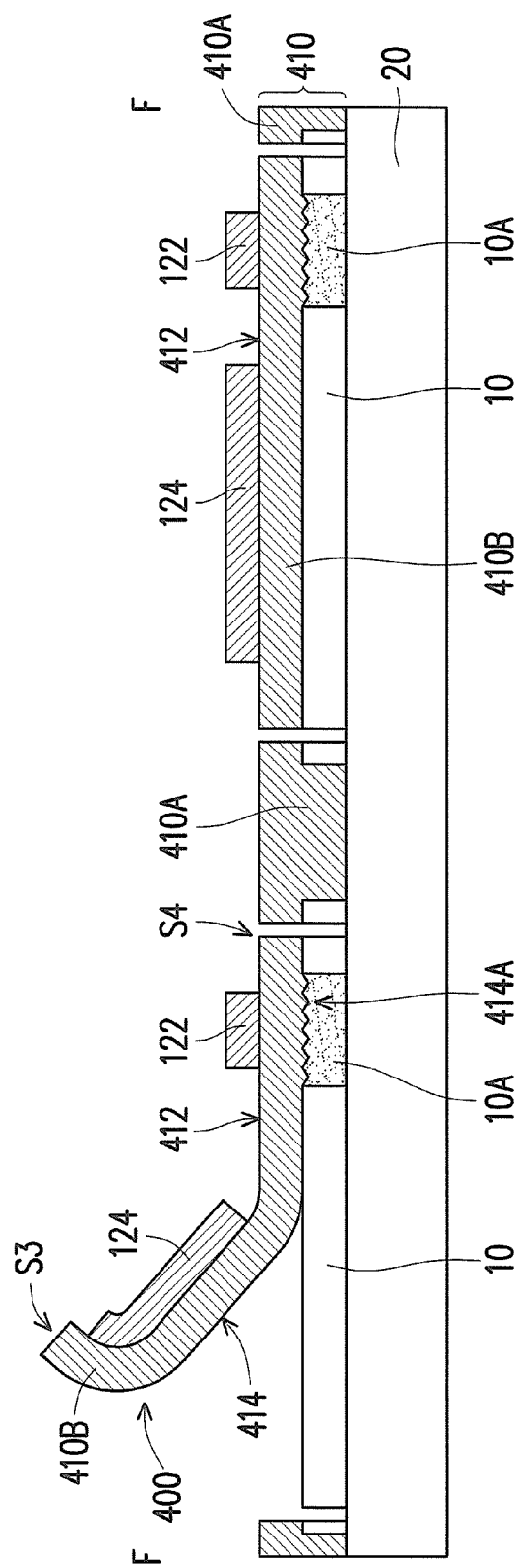
FIG. 13C is a cross-sectional view along line F-F of FIG. 13A.

FIG. 13A is a top view of a step of a fabrication method of a flexible device of the fourth embodiment of the disclosure, FIG. 13B is a cross-sectional view along line E-E of FIG. 13A, and FIG. 13C is a cross-sectional view along line F-F of FIG. 13A. Referring to FIG. 13A to FIG. 13C, the flexible device 400 is removed from the carrier 20, such as irradiating from one side of the carrier 20 toward the release layer 10 located in the first area 402 via a laser beam L so as to form a release layer 10A in the first area 402. In the present embodiment, since the edge of the flexible substrate 410B is exposed by the cut opening V, the irradiation path of the laser beam L starts from the first side S1 of the flexible substrate 410 and travels toward the second side S2 of the flexible substrate 410, and the first side S1 and the second side S2 are opposite sides. Moreover, the peeling direction of the removal of the flexible device 400 from the carrier 20 may be the same as FIG. 13C in that peel force is applied from a third side S3 of the flexible substrate 410B toward a fourth side S4 of the flexible substrate 410B, or the peel force is applied from the fourth side S4 of the flexible substrate 410B toward the third side S3 of the flexible substrate 410B. Here, the third side S3 is farther from the rigid element 122 and the fourth side S4 is closer to the rigid element 122. Therefore, when peeling the flexible device 400 from the carrier 20 via the method of FIG. 13C, the peeling step and the laser irradiation step may be performed at the same time, but the disclosure is not limited thereto. In other embodiments, the laser irradiation step may be before the peeling step. Moreover, similar to the above embodiments, in the laser irradiation step, a coarse structure 414A is formed on the second surface 414 of the flexible substrate 410B, and the laser irradiation step is only performed in the first area 402, and therefore the coarse structure 414A is also only located in the first area 402.

In the above embodiments, the irradiation of the laser beam may decompose or modify the release layer material and thereby reduce the adhesion of the release layer in the irradiated area. However, heat accumulation phenomenon may occur to the periphery of the area irradiated by the laser beam. The heat accumulation phenomenon may cause the adhesion of the release layer material to increase and is not good for the peeling step. Therefore, the irradiation method of a laser beam may be adjusted accordingly.

The irradiation method of a laser beam is described in the following based on the step of FIG. 2A.

Figure 14:
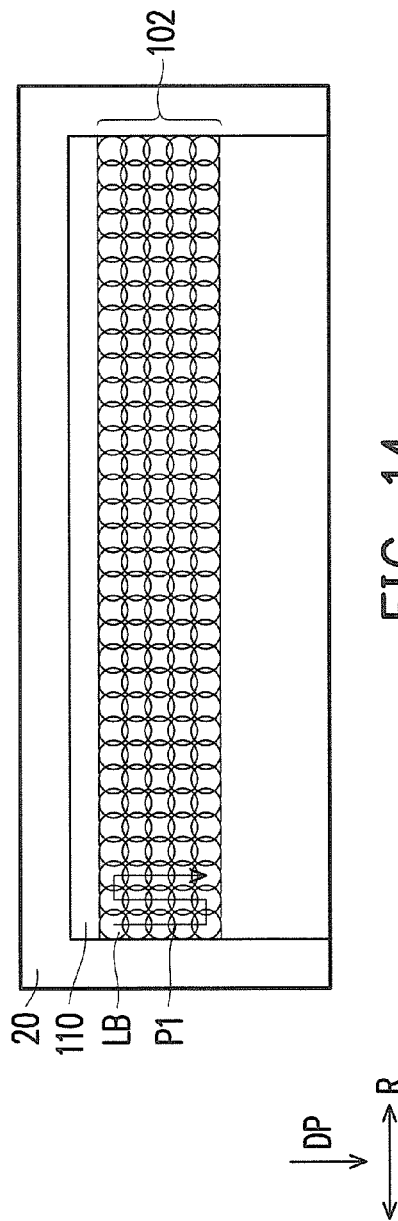
FIG. 14 is an embodiment of an irradiation method of a laser beam in the step of FIG. 2A.

FIG. 14 is an embodiment of an irradiation method of a laser beam in the step of FIG. 2A. Referring to FIG. 14A, the members in the present figure are all as described for FIG. 2A and are not repeated herein. When the laser irradiation step is performed via a dot laser beam LB, the irradiation point LB of the laser beam travels, for instance, along a trajectory P1. Moreover, the area of each irradiation point LB of the laser beam partially overlaps the area of the previous irradiation point LB. The irradiation points LB of the laser beam cover the entire first area 102, and therefore the coarse structure generated based on laser irradiation in the above embodiments also covers the entire first area 102.

Figure 15:
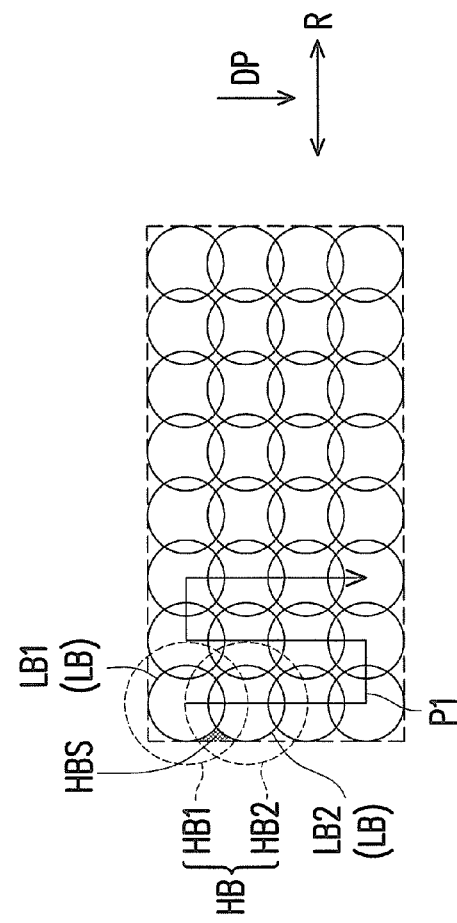
FIG. 15 shows a schematic of a laser irradiation point and a heat-affected zone under an irradiation method of FIG. 14.

FIG. 15 shows a schematic of a laser irradiation point and a heat-affected zone under an irradiation method of FIG. 14. Referring to both FIG. 14 and FIG. 15, the irradiation point LB of each laser beam corresponds to a heat-affected zone HB, and the area of the heat-affected zone HB is greater than the area of the irradiation point LB. When two overlapping irradiation points LB, such as irradiation points LB1 and LB2 are irradiated in a consecutive manner, the heat-affecting effect of the corresponding heat-affected zones HB1 and HB2 may be increased. Therefore, the overlapping portion of the heat-affected zones HB1 and HB2, such as a heat-affected zone HBS, has the most heat-affecting effect. In other words, the adhesion of the release layer material in the heat-affected zone HBS may be more increased. Therefore, when the flexible substrate 110 is to be peeled from the carrier 20 along the peeling direction DP, the heat-affected zone HBS is preferably not densely arranged in a direction R perpendicular to the peeling direction DP, which causes difficult peeling. In the present embodiment, since the irradiation point LB of the laser beam travels along the trajectory P1, the heat-affected zone HBS is arranged to be substantially parallel to the peeling direction DP, so as to prevent difficulty in peeling.

FIG. 16 and FIG. 17 are two other embodiments of the irradiation method of a laser beam in the step of FIG. 2A. In FIG. 16, the irradiation point LB of a laser beam travels, for instance, along a trajectory P2, and overlapping does not occur between irradiation points LB, wherein the trajectory P2 is substantially formed by the connection of a plurality of V-type paths. At this point, the irradiation points LB are distributed in a partial area of the first area 102, and therefore the coarse structure generated based on laser irradiation in the above embodiments is also distributed in a partial area of the first area 102. Moreover, in FIG. 17, overlapping may also not occur between the irradiation points LB, and the irradiation points LB of the laser beam travel along a trajectory P3, wherein the trajectory P3 may be similar to the trajectory P1 of FIG. 14 in that both are winding trajectories, but the trajectory P3 is more sparsely distributed and the trajectory P1 is more densely distributed.

Figure 18:
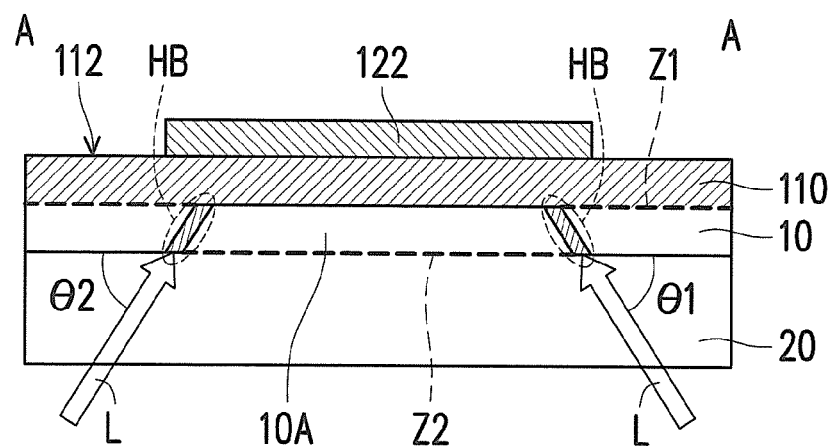
FIG. 18 and FIG. 19 are schematics of different embodiments of the laser irradiation step.
Figure 19:
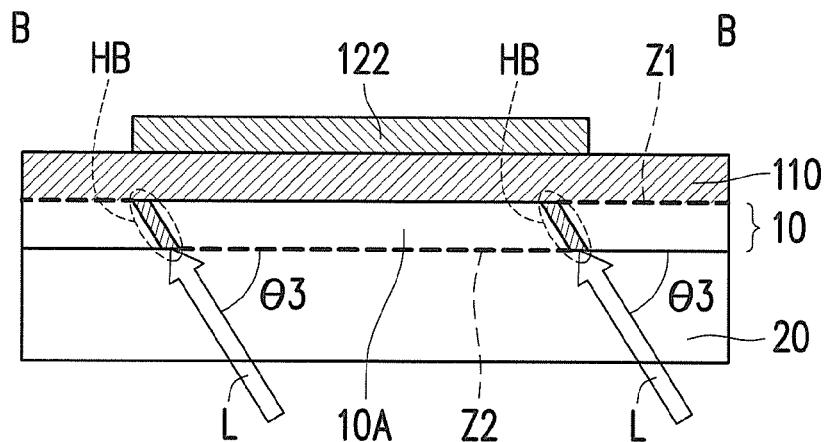

In addition to controlling the travel trajectory of the irradiation points, a negative effect to the peeling step by a heat-affected zone may also be reduced via the incident angle of the laser beam. For instance, FIG. 18 and FIG. 19 are schematics of different embodiments of the laser irradiation step. In FIG. 18 and FIG. 19, the irradiation direction of the laser beam L may be not perpendicular to the flexible substrate 110, and irradiation may be performed in the irradiation direction of an angle of □1, □2, or □3. Therefore, the release layer 10A irradiated by laser may have a trapezoidal (FIG. 18) or approximate parallelogram (FIG. 19) cross-sectional profile. By controlling the irradiation location of the laser beam, the heat-affected zone HB may be located at the edge of the rigid element 122 and inclined at an angle. In this way, the flexible substrate 110 is separated from the carrier 20 along separating interfaces Z1 and Z2 when removed from the carrier 20. In other words, in the area not irradiated by the laser beam, the separating interface Z1 is located between the release layer 10 and the flexible substrate 110, and in the area irradiated by the laser, since a portion of the material of the release layer 10A is decomposed, the separating interface Z2 is located between the release layer 10A and the carrier 20. In FIG. 18, the orthographic projections of the separating interface Z1 and the separating interface Z2 on the flexible substrate 110 are overlapped with each other and continuously cover the entire area of the flexible substrate 110, and therefore the flexible substrate 110 may be readily peeled from the carrier 20. The embodiment of FIG. 19 is no different.

In the fabrication method of a flexible electronic device of the embodiments of the disclosure, before the flexible device is removed from the carrier, a laser irradiation step . . . etc. is first performed on the area having greater stiffness to reduce the peel force needed for this area. Therefore, the fabrication method of a flexible electronic device has a desirable yield. Moreover, the embodiments of the disclosure do not readily damage members on the flexible device, and therefore the flexible device of the embodiments of the disclosure has a desirable quality.

It will be clear that various modifications and variations may be made to the disclosed methods and materials. It is intended that the specification and examples be considered as exemplary only, with a true scope of the disclosure being indicated by the following claims and their equivalents.

What is claimed is:

1. A flexible device having a first area and a second area, wherein a stiffness of a portion of the first area is greater than a stiffness of the second area, the flexible device comprising:
    a flexible substrate comprising a first surface and a second surface opposite to each other, and the second surface of the flexible substrate has a coarse structure in the first area, such that a surface roughness of the second surface in the first area is greater than a surface roughness of the second surface in the second area; and
    a rigid element disposed on the first surface of the flexible substrate and located in the first area, wherein a stiffness of the rigid element is greater than a stiffness of the flexible substrate and a projection area of the coarse structure on the flexible substrate overlaps an area of the rigid element.

2. The flexible device of claim 1, further comprising a functional element disposed on the first surface of the flexible substrate and located in the second area, wherein the stiffness of the rigid element is greater than a stiffness of the functional element.

3. The flexible device of claim 2, wherein the functional element comprises an organic light-emitting element, an inorganic light-emitting element, a sensing element, a display element, a battery element, or a combination thereof.

4. The flexible device of claim 2, wherein the rigid element is electrically connected to the functional element.

5. The flexible device of claim 2, wherein the rigid element is located in a periphery of the functional element.

6. The flexible device of claim 1, wherein the flexible substrate has at least one via defining one end of the first area.

7. The flexible device of claim 1, wherein the flexible substrate has at least one via located in the first area.

8. The flexible device of claim 1, wherein the first area is extended from a first side of the flexible substrate to a second side of the flexible substrate, and the first side and the second side are opposite sides.

9. The flexible device of claim 1, wherein the coarse structure covers the first area.

10. The flexible device of claim 1, wherein the coarse structure is distributed along a trajectory in the first area and distributed in a partial area of the first area.

11. A fabrication method of a flexible device, comprising:
    temporarily adhering a flexible substrate on a carrier via a release layer, wherein the flexible substrate has a first surface and a second surface, and the second surface is in contact with the release layer;
    forming at least one element on the first surface of the flexible substrate to form a flexible device, wherein the flexible device has a first area and a second area, and a stiffness of a portion of the first area is greater than a stiffness of the second area; and
    irradiating a laser beam from the carrier toward the release layer located in the first area, and an irradiation path of the laser beam falls in the first area.

12. The method of claim 11, further comprising, after the irradiation of the laser beam is complete, removing the flexible device from the carrier, such that the flexible substrate and the carrier are separated.

13. The method of claim 11, further comprising, before the irradiation of the laser beam is performed, performing a processing step to form at least one via on the flexible substrate to expose the release layer or the carrier.

14. The method of claim 13, wherein the at least one via comprises a first via and a second via respectively defining two opposite ends of the first area, and the irradiation path of the laser beam starts from a location of the first via and ends at a location of the second via.

15. The method of claim 11, wherein the irradiation path of the laser beam starts from a first side of the flexible substrate and travels toward a second side of the flexible substrate, and the first side and the second side are opposite sides.

16. The method of claim 11, wherein an irradiation area of the laser beam covers the first area.

17. The method of claim 11, wherein an irradiation area of the laser beam accounts for a portion of the first area.

18. The method of claim 11, wherein an irradiation direction of the laser beam is not perpendicular to the flexible substrate.

19. The method of claim 11, wherein an area of the release layer is less than the flexible substrate and a portion of the flexible substrate is in contact with the carrier.

20. The method of claim 19, further comprising, before the irradiation of the laser beam is performed, performing a processing step on the flexible substrate to form a cut opening, and the cut opening surrounds the release layer and exposes the release layer or the carrier.

* * * * *